(12) United States Patent
Melanson

(10) Patent No.: US 7,187,312 B2
(45) Date of Patent: Mar. 6, 2007

(54) LOOK-AHEAD DELTA SIGMA MODULATOR HAVING AN INFINITE IMPULSE RESPONSE FILTER WITH MULTIPLE LOOK-AHEAD OUTPUTS

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/037,311

(22) Filed: Jan. 18, 2005

(65) Prior Publication Data

US 2005/0156771 A1 Jul. 21, 2005

Related U.S. Application Data

(60) Provisional application No. 60/588,951, filed on Jul. 19, 2004, provisional application No. 60/539,132, filed on Jan. 26, 2004, provisional application No. 60/537,285, filed on Jan. 16, 2004.

(51) Int. Cl.
*H03M 3/00* (2006.01)

(52) U.S. Cl. ...................................... 341/143

(58) Field of Classification Search ............... 341/143, 341/61, 126, 144, 145, 150, 155, 157, 159, 341/131, 148; 330/282; 358/463; 375/148, 375/229, 262; 455/192.2; 708/320, 300, 708/313; 704/222, 243; 379/406.08
See application file for complete search history.

(56) References Cited

U.S. PATENT DOCUMENTS

| | | | |
|---|---|---|---|
| 5,548,286 A | 8/1996 | Craven | |
| 5,550,544 A | 8/1996 | Sakiyama et al. | |
| 5,585,801 A | 12/1996 | Thurston | 341/143 |
| 5,598,159 A | 1/1997 | Hein | |
| 5,708,433 A | 1/1998 | Craven | |
| 5,732,002 A * | 3/1998 | Lee et al. | 708/313 |

(Continued)

FOREIGN PATENT DOCUMENTS

| | | |
|---|---|---|
| EP | 0512687 | 11/1992 |
| EP | 1227595 | 7/2002 |
| JP | PUB. 2003-124812 | 4/2003 |

OTHER PUBLICATIONS

Angus, James A.S., "Tree Based Lookahead Sigma Delta Modulators," Audio Engineering Society 114th Convention, Convention Paper 5825, Mar. 22-25, 2003.

(Continued)

*Primary Examiner*—Howard L. Williams
(74) *Attorney, Agent, or Firm*—Hamilton & Terrile, LLP; Kent B. Chambers

(57) ABSTRACT

A delta sigma modulator look-ahead IIR filter response can be divided into a natural response and a pattern response using superposition techniques. The look-ahead delta sigma modulators of the signal processing systems described herein include an infinite impulse response filter ("IIR") that produces multiple output look-ahead natural responses to input signals having a look-ahead depth of "M". The multiple output lookahead IIR filter reduces the amount of processing and memory used by the delta sigma modulator to generate quantizer output values. The multiple output lookahead IIR filter uses extended delay stages and modified feedback coefficients to concurrently produce multiple look-ahead natural responses. In one embodiment, the multiple output lookahead IIR filter concurrently produces M look-ahead natural responses.

29 Claims, 17 Drawing Sheets

U.S. PATENT DOCUMENTS

| | | | |
|---|---|---|---|
| 5,742,246 A | 4/1998 | Kuo et al. | |
| 5,757,300 A * | 5/1998 | Koilpillai et al. | 341/143 |
| 5,757,517 A | 5/1998 | Couwenhoven et al. | |
| 5,786,779 A * | 7/1998 | Chun et al. | 341/61 |
| 5,808,924 A * | 9/1998 | White | 708/313 |
| 5,977,899 A | 11/1999 | Adams et al. | |
| 6,067,515 A | 5/2000 | Cong et al. | 704/243 |
| 6,070,136 A | 5/2000 | Cong et al. | 704/222 |
| 6,112,218 A * | 8/2000 | Gandhi et al. | 708/320 |
| 6,160,505 A | 12/2000 | Vaishampayan | |
| 6,177,897 B1 * | 1/2001 | Williams, III | 341/150 |
| 6,232,899 B1 | 5/2001 | Craven | |
| 6,256,383 B1 * | 7/2001 | Chen | 379/406.08 |
| 6,310,518 B1 | 10/2001 | Swanson | |
| 6,313,773 B1 * | 11/2001 | Wilson et al. | 341/143 |
| 6,347,297 B1 | 2/2002 | Asghar et al. | 704/243 |
| 6,362,769 B1 | 3/2002 | Hovin et al. | |
| 6,373,416 B1 | 4/2002 | McGrath | |
| 6,392,576 B1 * | 5/2002 | Wilson et al. | 341/143 |
| 6,418,172 B1 * | 7/2002 | Raghavan et al. | 375/262 |
| 6,480,129 B1 | 11/2002 | Melanson | |
| 6,480,528 B1 * | 11/2002 | Patel et al. | 375/148 |
| 6,501,404 B2 | 12/2002 | Walker | |
| 6,590,512 B2 * | 7/2003 | Roh et al. | 341/143 |
| 6,639,531 B1 | 10/2003 | Melanson | |
| 6,724,332 B1 | 4/2004 | Melanson | |
| 6,760,573 B2 | 7/2004 | Subrahmanya et al. | |
| 6,822,594 B1 | 11/2004 | Melanson et al. | |
| 6,842,128 B2 * | 1/2005 | Koh | 341/143 |
| 6,842,486 B2 | 1/2005 | Plisch et al. | |
| 6,861,968 B2 | 3/2005 | Melanson | |
| 6,870,879 B2 * | 3/2005 | Gazsi et al. | 375/229 |
| 6,873,278 B1 | 3/2005 | Ferguson et al. | |
| 6,873,280 B2 * | 3/2005 | Robinson et al. | 341/159 |
| 6,879,275 B1 | 4/2005 | Melanson | |
| 6,888,484 B2 * | 5/2005 | Kiss et al. | 341/143 |
| 6,933,871 B2 | 8/2005 | Melanson | |
| 6,940,434 B2 | 9/2005 | Brooks | 341/131 |
| 6,956,514 B1 | 10/2005 | Melanson et al. | 341/143 |
| 6,967,606 B2 | 11/2005 | Wiesbauer et al. | 341/143 |
| 7,007,053 B1 * | 2/2006 | Malik et al. | 708/300 |
| 7,009,543 B2 * | 3/2006 | Melanson | 341/143 |
| 2003/0086366 A1 | 5/2003 | Branlund et al. | |
| 2003/0231729 A1 | 12/2003 | Chien et al. | |
| 2005/0012649 A1 | 1/2005 | Adams et al. | |
| 2005/0052300 A1 | 3/2005 | Ranganathan | |

OTHER PUBLICATIONS

Harpe, Pieter, et al., "Efficient Trellis-Type Sigma Delta Modulator," Audio Engineering Society 114th Convention, Convention Paper 5845, Mar. 22-25, 2003.

Hawksford, M.O.J., "Parametrically Controlled Noise Shaping in Variable State-Step-Back Pseudo-Trellis SDM," Audio Engineering Society 115th Convention, Convention Paper, Oct. 10-13, 2003.

Kato, Hiroshi, "Trellis Noise-Shaping Converters and 1-bit Digital Audio," Audio Engineering Society 112th Convention, Convention Paper 5615, May 10-13, 2002.

Sony Electronics, Inc. and Philips Electronics N.V., "Super Audio Compact Disc, A Technical Proposal," no month, 1997.

Paulos, John J. et al., "Improved Signal-To-Noise-Ratio Using Tri-Level Delta-Sigma Modulation," Reprinted from IEEE Proc. ISCAS, May no date, 1987, pp. 245-248.

Knapen, Eric et al., "Lossless Compression of 1-Bit Audio," J. Audio Eng. Soc., vol. 52, No. 3, Mar. no date, 2004, pp. 190-199.

Zetterberg, L.H. et al., "Adaptive Delta Modulation with Delayed Decision," IEEE Transactions on Communications, IEEE vol. COM-22, No. 9, Sep. no date, 1974, pp. 1194-1198.

Stonick, J.T. et al., "Look-Ahead Decision-Feedback $\Sigma\Delta$ Modulation," IEEE International Conference on Acoustics, Speech and Signal Processing, New York, no month, 1994.

Abeysekera, S. et al., "Design of Multiplier Free FIR Filters Using a LADF Sigma-Delta Modulator," Circuits and Systems, 2000, Proceedings, ISCAS 2000 Geneva, The 2000 IEEE International Symposium, May 28-31, 2000, vol. 2, May 28, 2000, pp. 65-68.

Abeysekera, S.S. et al., "Performance Evaluation of $3^{rd}$ Order Sigma-Delta Modulators via FPGA Implementation," ASIC/SOC Conference, 2001, Proceedings, 14th Annual IEEE International Sept. 12-15, 2001, pp. 13-17.

Magrath, A.J. et al., "Performance Enhancement of Sigma-Delta Modulator D-A Converters Using Non-Linear Techniques," 1996 IEEE Symposium on Circuits and Systems (ISCAS), vol. 2, May 12, 1996, pp. 277-280.

Magrath, A.J. et al., "Non-Linear Deterministic Dithering of Sigma-Delta Modulators," IEE Colloquium on Oversampling and Sigma Delta Strategies for DSP, no month, 1995, pp. 1-6.

Lindfors, S., "A Two-Step Quantization $\beta\Sigma$-Modulator Architecture with Cascaded Digital Noise Cancellation," Electronics, Circuits and Systems, 2000, ICECS, The 7th IEEE International Conference, Dec. 17-20, 2000, vol. 1, pp. 125-128.

Harris, F.J. et al., "Implementation Considerations and Limitations for Dynamic Range Enhanced Analog to Digital Converters," IEEE International Conference on Acoustics, Speech and Signal Processing, May 23, 1989, pp. 1286-1289.

Fang, L. et al., "A Multi-Bit Sigma-Delta Modulator with Interstate Feedback," Circuits and Systems, 1998, Proceedings of the 1998 International Symposium, May 31-Jun. 3, 1998, vol. 1, pp. 583-586.

* cited by examiner $$H_x(z) = \frac{1}{(1-z^{-1})^2}$$

$$H_{fb}(z) = \frac{(-c2 + (c2 - c1)z^{-1})\, z^{-1}}{(1-z^{-1})^2}$$

$$H_x(z) = \frac{z^{-2}}{(1-z^{-1})2}$$

$$H_{fb}(z) = \frac{(-c2 + (c2 - c1)z^{-1})\, z^{-1}}{(1-z^{-1})^2}$$

| In out | sv0 | sv1 | sv2 | sv3 | |
|---|---|---|---|---|---|
| 1 | 0 | 0 | 0 | 0 | |
| 0 | -c1 | -c2 | 0 | 0 | |
| 0 | -c1 | -c1-c2 | -c2 | 0 | Orig<br>lookahead 1 |
| 0 | -c1 | -2c1-c2 | -c1-c2 | -c2 | ← lookahead 2 |

LOOK-AHEAD DELTA SIGMA MODULATOR HAVING AN INFINITE IMPULSE RESPONSE FILTER WITH MULTIPLE LOOK-AHEAD OUTPUTS

CROSS-REFERENCE TO RELATED APPLICATION

This application claims the benefit under 35 U.S.C. § 119(e) of (i) U.S. Provisional Application No. 60/537,285, filed Jan. 16, 2004 and entitled "Look-Ahead Delta-Sigma Modulators", (ii) U.S. Provisional Application No. 60/539,132, filed Jan. 26, 2004 and entitled "Signal Processing Systems with Look-Ahead Delta-Sigma Modulators", and (iii) U.S. Provisional Application No. 60/588,951, filed Jul. 19, 2004 and entitled "Signal Processing Systems with Look-Ahead Delta-Sigma Modulators". Provisional applications (i) through (iii) include example systems and methods and are incorporated by reference in their entireties.

This application claims the benefit under 35 U.S.C. § 120 of U.S. patent application Ser. No. 10/995,731, filed Nov. 22, 2004, entitled "Look-Ahead Delta Sigma Modulator with Quantization Using Natural and Pattern Loop Filter Responses", and inventor John L. Melanson (referred to herein as the "Melanson I Patent"). The Melanson I Patent includes example systems and methods and is incorporated by reference in its entirety.

BACKGROUND OF THE INVENTION

Field of the Invention

The present invention relates in general to the field of signal processing, and more specifically to a system and method for processing signals using a look-ahead delta sigma modulator having an infinite impulse response filter with multiple look-ahead outputs.

DESCRIPTION OF THE RELATED ART

A few signal processing systems implement look-ahead delta-sigma modulators in an attempt to obtain superior input/output signal fidelity by minimizing long term error. "Delta-sigma modulators" are also commonly referred to using other interchangeable terms such as "sigma-delta modulators", "delta-sigma converters", "sigma delta converters", and "noise shapers".

Conventional research in look-ahead modulators primarily involves two threads. The first are the works of Hiroshi Kato, "Trellis Noise-Shaping Converters and 1-bit Digital Audio," AES 112$^{th}$ Convention, May 10–13 2002 Munich, and Hiroshi Kato, Japanese Patent JP, 2003-124812 A, and further refinements described in Harpe, P., Reefman D., Janssen E., "Efficient Trellis-type Sigma Delta Modulator," AES 114$^{th}$ Convention, Mar. 22–25 2003 Amsterdam (referred to herein as "Harpe"); James A. S. Angus, "Tree Based Look-ahead Sigma Delta Modulators," AES 114$^{th}$ Convention, Mar. 22–25 2003 Amsterdam; James A. S. Angus, "Efficient Algorithms for Look-Ahead Sigma-Delta Modulators," AES 155$^{th}$ Convention, Oct. 10–13 2003 New York; Janssen E., Reefman D., "Advances in Trellis based SDM structures," AES 115$^{th}$ Convention, Oct. 10–13 2003 New York. This research targets solving the problems of 1-bit encoding of audio data for storage without using the steep anti-alias filters associated with pulse code modulation "PCM." The advent of super audio compact disc "SACD" audio storage, with its moderate oversampling ratios (32 or 64), motivated this work.

FIG. 1 depicts a prior art signal processing system 100 having a look-ahead delta-sigma modulator 102. The signal source 102 provides an input signal to pre-processing components 104. Preprocessing components 104 include an analog-to-digital converter ("ADC") and oversampling components to generate a k-bit, digital input signal x(n). For audio applications, x(n) generally represents a signal sampled at 44.1 kHz times an oversampling ratio, such as 64:1. Look-ahead modulator 106 quantizes input signal x(n) and shapes the quantization noise so that most of the quantization noise is moved out of the signal band of interest, e.g. approximately 0–20 kHz for audio applications. Each output signal y(n) (also referred to herein as an "output value") generally has one of two values selected from the set $\{+\Delta/2, -\Delta/2\}$ with "$\Delta$" representing the full swing of y(n). (For convenience, $\Delta/2$ will be represented as +1, and $-\Delta/2$ will be represented as −1.). The output signal y(n) can be further processed and, for example, used to drive an audio sound system or can be recorded directly onto a storage medium.

FIG. 2 depicts a schematic representation of a conventional look-ahead delta-sigma modulator 106 with a look-ahead depth of M. Table 1 describes an embodiment of the symbols used in FIG. 2.

TABLE 1

| Symbol | Definition |
| --- | --- |
| x(n) | The nth discrete input signal. |
| $X_t$ | Input signal vector at a time t. |
| y(n) | The nth discrete output signal. |
| $Y_{Di}$ | The ith output delayed by one candidate vector. |
| $C_i$ | The ith cost value vector = $H(D_i(z))$. |
| M | Look-ahead depth. |
| N | $N = r^M$ = The number of output signal candidate sets under consideration, and r = number of possible values for y(n). |
| i | i is selected from the set $\{0, 1, 2, \ldots N-1\}$. |
| $C^{(2)}_i$ | The ith cost value power. |
| $C^{(2)}_{min}$ | The minimum cost value power at time t. |

The look-ahead depth M refers to the dimension of each delayed output candidate vector $Y_{Di}$ used to determine output signal y(n). For time t, a negative delayed output candidate vector $-Y_{Di}$, $i \in \{0,1,2,\ldots,N-1\}$ and the input vector $X_t$ are inputs to noise shaping filter 202(i). For a look-ahead depth of M and y(n)=$\{-1, +1\}$, and without pruning output candidates, each of the N delayed output candidate vectors contains a unique set of elements. Each noise-shaping filter 202(i) of look-ahead delta-sigma modulator 106 uses a common set of filter state variables for time t during the calculations of respective cost value vectors $C_i$. Filter 202 maintains the actual filter state variables used during the calculation of each y(n). The state variables are updated with the selected y(n) output value. Loop filter 202 processes $X_i$ and $-Y_i$ to produce an error value, which in this embodiment is referred to as cost value vector $C_i$. Cost value vector $C_i$, and, thus, each element of cost value vector $C_i$ is a frequency weighted error value. In some embodiments of look-ahead delta-sigma modulator 106, input signal vector $x_t$ and delayed output candidate vectors $Y_{Di}$ are also used as direct inputs to filter 202(i).

Quantizer error and output generator 203 includes two modules to determine y(n). The cost function minimum search module 204 computes the cost value power, $C_i^{(2)}$, of each cost value vector $C_i$ in accordance with Equation 1, and determines the minimum cost value power at time t.

$$C_i^{(2)} = \sum_{t=1}^{t=M} [c_t]^2.$$ Equation 1

"$c_t$" represents a cost value for time t, t=1 through M, in the cost vector $C_i$. Thus, the cost function minimum search module 204 of quantizer 203 attempts to minimize the energy out of loop filter 202. Minimizing the energy out of loop filter 202 effectively drives the input $C_i$ to a small value, which effectively results in a relatively high loop gain for look-ahead delta-sigma modulator 106 and, thus, modifies the noise shaping transfer function in an undesirable way.

The y(n) selector module 206 selects y(n) as the leading bit of $Y_i$ where $C_i^{(2)}{}_{min}$ represents the minimum cost value power.

For example, if M=2 and y∈{−1,+1}, then N=4, i□{0,1, 2,3}, and Table 2 represents each of the Y output candidate vectors and $X_t$.

TABLE 2

|  | $Y_1$ | $Y_2$ | $Y_3$ | $Y_4$ | $X_t$ |
|---|---|---|---|---|---|
| $y_t$ | 0 | 0 | 1 | 1 | x(n) |
| $y_{t+1}$ | 0 | 1 | 0 | 1 | x(n + 1) |

If $C_3^{(2)}$ represents the minimum cost value power, then selector module 206 selects y(n)=1 because the first bit in output candidate vector $Y_3$ (the output candidate vector associated with $C_3^{(2)}$), equals 1. If $C_1^{(2)}$ represents the minimum cost value power, then selector module 206 selects y(n)=0 because the first bit in output candidate vector $Y_1$ (the output candidate vector associated with $C_1^{(2)}$), equals 0.

The second primary thread of look-ahead modulator research involves pulse width modulation ("PWM") amplifiers based on delta-sigma modulators combined with digital PWM modulation stages. The principal researchers have been Peter Craven and John L. Melanson. In U.S. Pat. No. 5,784,017 entitled "Analogue and Digital Converters Using Pulse Edge Modulations with Non-Linear Correction,"inventor Peter Craven ("Craven"), which is incorporated herein by reference in its entirety, Craven described the use of look-ahead in delta-sigma modulators. The purpose of Craven was to ensure stability in alternating edge modulation, an inherently difficult modulation mode to stabilize. In the PWM case, the delta-sigma modulator is operating at a low oversampling ratio (typically 4–16), and quantization noise is a special problem.

FIG. 3 depicts quantizer 106 and noise shaping loop filter 202. The filter 202 can be considered as having a noise transfer function ("NTF") and a separate signal transfer function ("STF"), as described in commonly assigned U.S. patent application Ser. No. 10/900,877, filed Jul. 28, 2004, entitled "Signal Processing with Lookahead Modulator Noise Quantization Minimization", inventor John L. Melanson (referred to herein as the "Melanson II Patent" and in chapter 4 of Norsworthy et al, "Delta Sigma Data Converters—Theory, Design, and Simulation", 1997, ISBN 0-7803-1045-4). The noise transfer function ("NTF") equals 1/[1+$z^{-1}*H_2(z)$]. Filter 202 is modeled to indicate the signal transfer function $H_1(z)$, the feedback signal transfer function $H_2(z)$, and quantization noise 302. The signal transfer function ("STF") equals $H_1(z)/[1+z^{-1}*H_2(z)]$. In some implementations, H1 and H2 are identical. In the general case, H1 and H2 differ.

FIG. 4A depicts a delta sigma modulator 400A with a fourth order noise shaping loop filter 402, quantizer 404, and feedback loop with a unit delay 406, which represents one embodiment of noise shaping filter 202. Constants k0, k1, k2, and k3 are chosen to set poles in the NTF of filter 300. G1 provides a zero (0) in the NTF, which is usually set near a high frequency end of the signal pass band. Filter 400 also includes a double zero at 0 Hz. The STF has a pure pole response cascaded with a pure delay.

FIG. 4B depicts a 3rd order infinite impulse response filter 400B with delays $z^{-1}$, feedback coefficients $C_0$, $C_1$, and $C_2$, and state variables sv0, sv1, and sv2. In infinite impulse response ("IIR") filters, one or more state variables are fed back during each time step to modify one or more of the next state variables. This feeding back of state variables makes it difficult to calculate future values of the filter output for look-ahead applications. The look ahead feature is of special interest in the case of delta-sigma modulation, where the feedback is quantized to a relatively small number of levels, and there are significant advantages to observing more than one potential feedback value at any given time.

One technique to implement an IIR filter adapted for look-ahead operations is depicted in IIR filter process 400C in FIG. 4C, which saves all of the state variables, advances the system clock to find future values, and then restores the state of the state variables. Operation 420 copies state variables to temporary memory, advances states with desired feedback N times (N=$2^m$ and m=lookahead depth) in operation 422, calculates state variables using desired output candidate vector elements in operation 424, stores the state variables in operation 426, and advances state one time in operation 428. The $3^{rd}$ order IIR filter 400B has a look-ahead depth of 4 and includes the current output and 2 future outputs. Another approach is to have multiple copies of the state variables, each representing the state variable for various states of advance or for various feedback possibilities. This approach complicates the calculation, and increases the size of the state variable memory, in some cases exponentially with the look-ahead depth. In all of these cases, the future values of the input are needed to calculate the future outputs. State variable memory operations 400D for filter 400B and the $z^{-3}$ delay at the input is depicted in FIG. 4D.

In a Trellis modulator, output candidate vectors Yi (also referred to as "patterns"), extending for M sample periods, are tried as candidates for the quantizer output. The power out of the filter, signal Ci, is summed for each output candidate vector $Y_i$, and the lowest power associated output candidate vector is chosen. The first bit of the chosen output candidate vector $Y_i$ is chosen as the next output value y(n), and the iteration is repeated for the next input vector $X_{t+1}$.

Conventional look-ahead delta sigma modulators require a great deal of computation and state storage. For a look-ahead depth of 8 bits, in the simplest case 256 copies of the delta sigma modulator are required. Most research has been directed to simplifying the computation by pruning the search so that only a moderate fraction of the $2^M$ cases are calculated. Conventional technology has not proposed a reasonable way to find the closest matching output signal sets for each time t directly given that without pruning there are $2^M$ possible reasonable combinations to search and the length of output signals Y[n] for a 1 minute signal is 60*44100*64 (i.e., 60 seconds, 44.1 kHz sampling frequency, and 64:1 oversampling ratio). Trellis searches, tree searches, and pruning have all been proposed as solutions to reducing the computation.

SUMMARY OF THE INVENTION

In one embodiment of the present invention, a method of processing a signal using a multiple output infinite impulse response ("IIR") filter of a look-ahead delta-sigma modulator includes determining a set of state variables for respective stages of the IIR filter for a time t from a set of input signals, wherein at least a subset of the state variables of the respective stages of the IIR filter represents a current response and at least one future response element of a natural response vector of the IIR filter. The method also includes determining a quantization output of the look-ahead delta sigma modulator for time t using the natural response vector determined for time t.

In another embodiment of the present invention, a method of processing a signal using a multiple output infinite impulse response ("IIR") filter of a look-ahead delta-sigma modulator includes updating a set of state variables of the IIR filter. The method also includes conducting a memory-less operation to determine elements of a natural response vector using the updated set of state variables, wherein the elements of the natural response vector include a current response output and at least one future response output of the IIR filter to a set of input signal samples. The method further includes determining a quantization output of the look-ahead delta sigma modulator for time t using the natural response outputs.

In another embodiment of the present invention, a signal processing system includes a look-ahead delta sigma modulator having a depth of M. The look-ahead delta sigma modulator includes an infinite impulse response (IIR) loop filter to filter a set of input signal samples, the IIR loop filter having K natural response outputs for each of K elements of a natural response vector $SNAT_t$ for each time t, wherein at least one output is for a future output and $1 < K \leq M$. The look-ahead delta-sigma modulator further includes a quantizer to determine a quantization output for each time t using the natural response vector $SNAT_t$.

In a further embodiment of the present invention, an apparatus for processing a signal using a multiple output infinite impulse response ("IIR") filter of a look-ahead delta-sigma modulator includes means for determining a set of state variables for respective stages of the IIR filter for a time t from a set of input signals, wherein at least a subset of the state variables of the respective stages of the IIR filter represents a current response and at least one future response element of a natural response vector of the IIR filter. The apparatus also includes means for determining a quantization output of the look-ahead delta sigma modulator for time t using the natural response vector determined for time t.

In another embodiment of the present invention, a method of determining feedback coefficients for a multiple output, L-order, infinite impulse response ("IIR") filter of a look-ahead delta-sigma modulator of depth M, wherein the IIR filter includes a plurality of state variables and M is an integer greater than one includes determining feedback coefficients for the IIR filter from the state variables using (i) an at least approximately zero input, (ii) feedback coefficients setting a characteristic of the IIR filter without K−1 natural response delay stages, wherein $1 < K \leq M$, and (iii) an impulse function forced feedback response followed by L—1 at least approximately zeros, wherein the feedback coefficients for the IIR filter comprise state variables of each of the initial stages and the K−1 natural response delay stages after completion of the impulse function and L−1 zeros.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

The nomenclature used in the below description is the same as used in the Background section above unless indicated otherwise.

A delta sigma modulator look-ahead IIR filter response can be divided into a natural response and a pattern response using superposition techniques as described in the Melanson I Patent. The look-ahead delta sigma modulators of the signal processing systems described herein include an infinite impulse response filter ("IIR") that produces multiple look-ahead natural responses to input signals having a look-ahead depth of "M". The multiple output lookahead IIR filter reduces the amount of processing and memory used by the delta sigma modulator to generate quantizer output values. The multiple output lookahead IIR filter uses extended delay stages and modified feedback coefficients to integrally produce multiple look-ahead natural responses thereby reducing memory usage and state variable computations. In one embodiment, the multiple output lookahead IIR filter concurrently produces M look-ahead natural responses.

Superposition can be applied to a loop filter response of the look-ahead delta sigma modulator. By superposition, the complete loop filter response for each vector in a set of vectors equals the difference between a forced pattern response and a natural input signal response. In one embodiment, the set of vectors used to determine the forced pattern response is identical to a set of output candidate vectors. In another embodiment, the set of vectors used to determine the forced pattern response represents approximations to a set of output candidate vectors that provide acceptable results. The forced pattern response of the loop filter can be determined from the response to each of the vectors with an input signal set to at least approximately zero (0) and the initial state variables in the loop filter set to at least approximately zero prior to determining the loop filter response of each vector. "At least approximately zero" includes zero (0) and values small enough to adequately determine the response of the filter within a desired accuracy. The pattern response of the loop filter can also be referred to as a forced pattern response of the loop filter to as set of vectors. The natural input signal response of the loop filter can be determined from the response to each input signal vector with feedback data set to at least approximately zero. The forced pattern response is independent of the input signal data and, therefore, can be determined once for input signal vectors $X_t$ for all times t.

Figure 1:
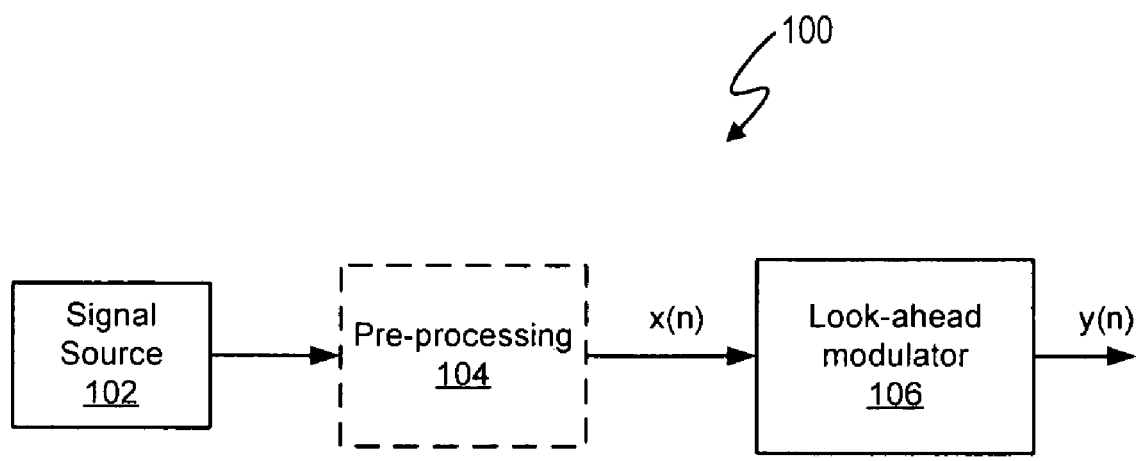
FIG. 1 (labeled prior art) depicts a signal processing system having a look-ahead delta-sigma modulator.
Figure 2:
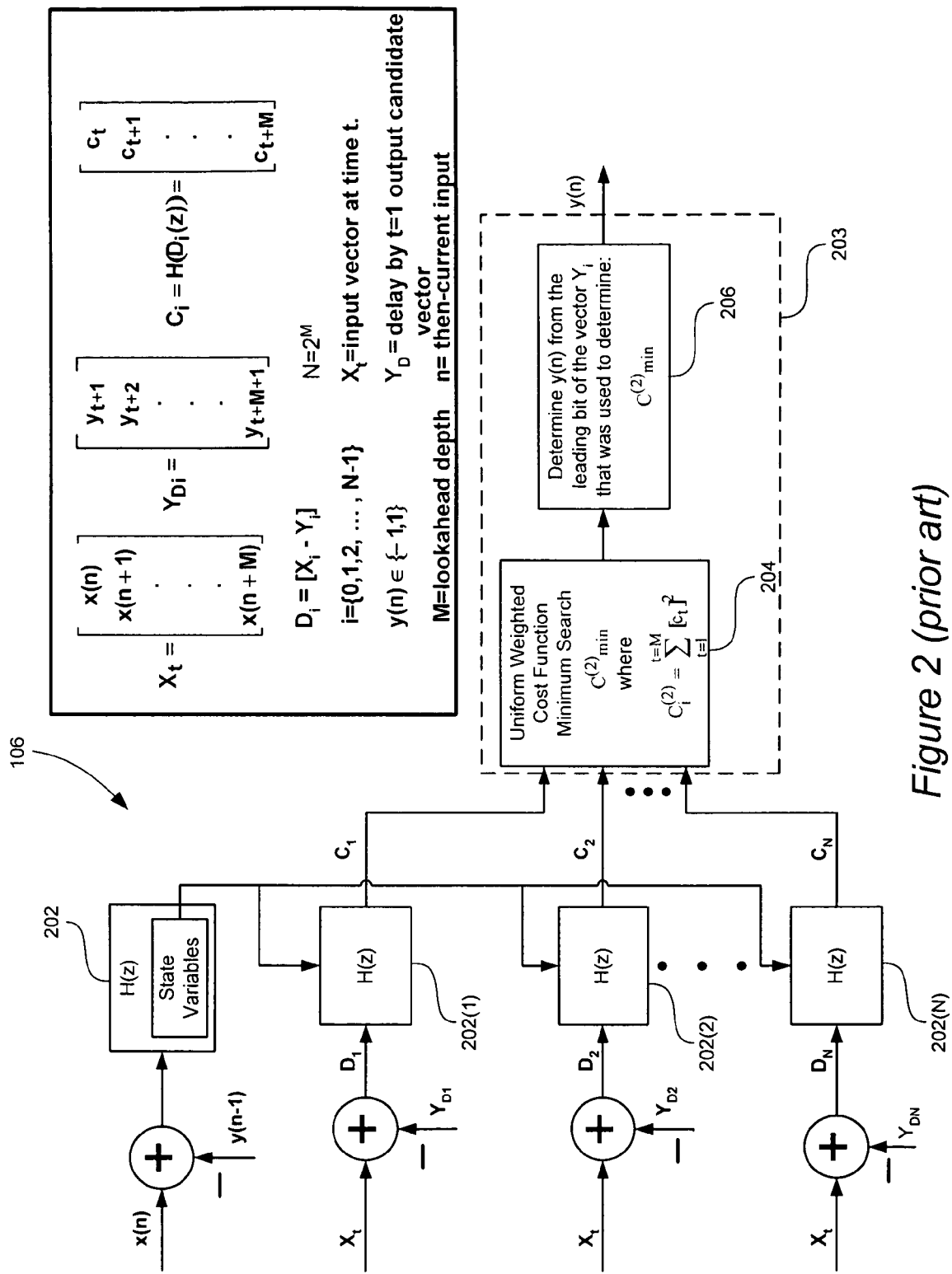
FIG. 2 (labeled prior art) depicts a schematic representation of a conventional look-ahead delta-sigma modulator.
Figure 3:
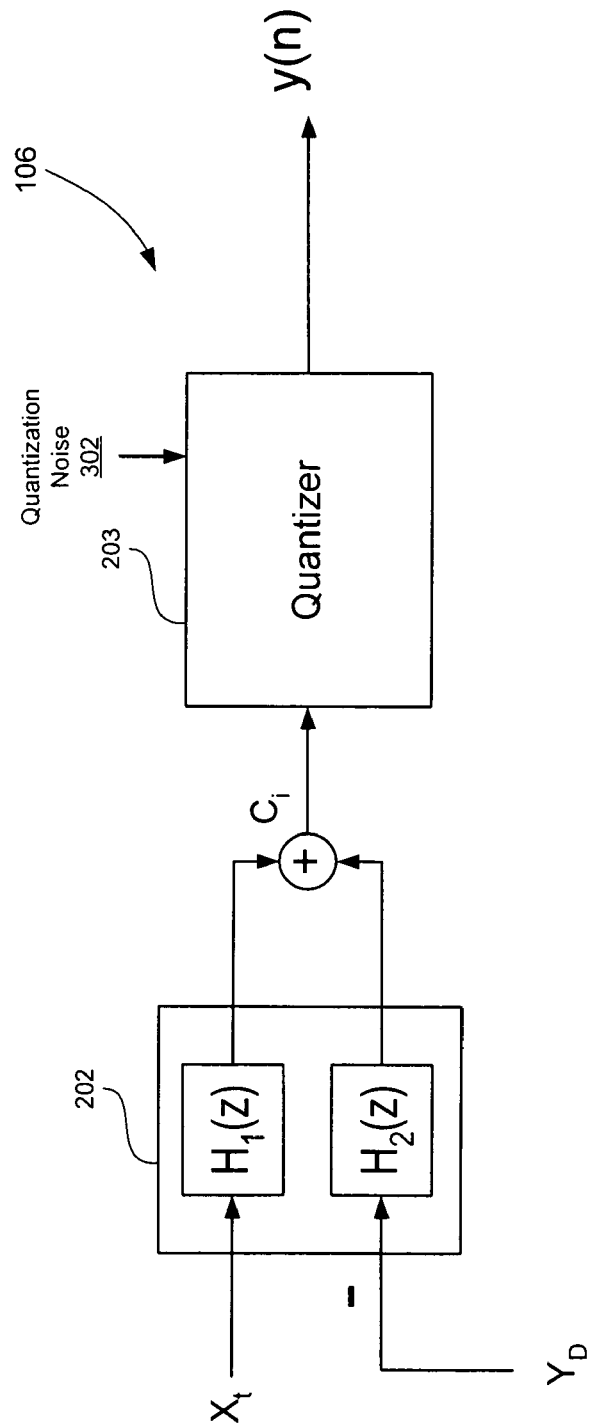
FIG. 3 (labeled prior art) depicts a quantizer and noise shaping filter.
Figure 5:
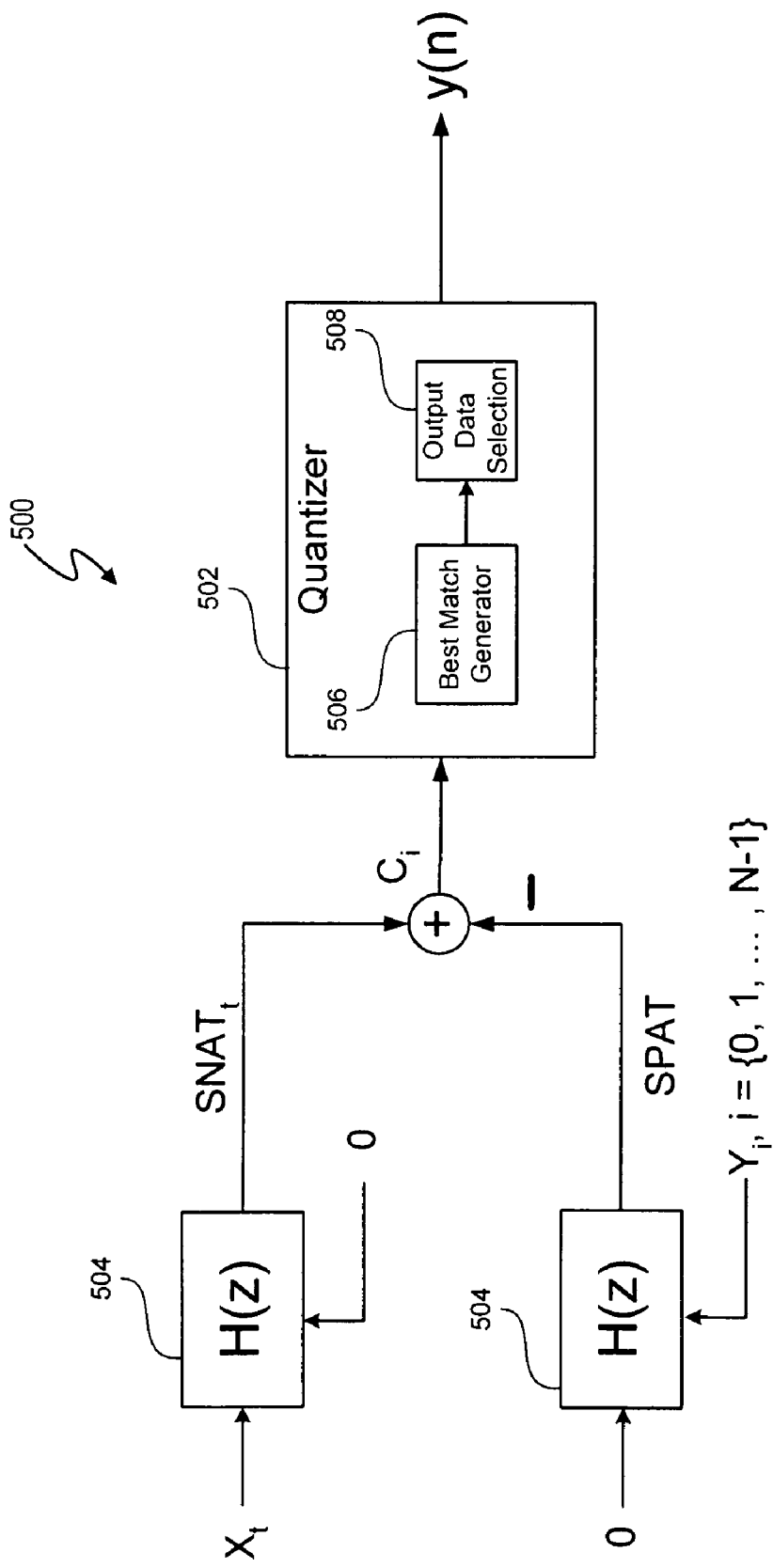
FIG. 5 depicts a look-ahead delta sigma modulator that utilizes superposition concepts to separate the input signal natural response SNAT from the forced pattern response SPAT.

FIG. 5 depicts a look-ahead delta sigma modulator 500 that utilizes superposition concepts to separate the input signal natural response SNAT from the forced pattern response SPAT. "SPAT$_i$" is a vector representing the forced pattern response of loop filter 504 to the $i^{th}$ output candidate vector $Y_i$, and SNAT$_t$ is a vector representing the loop filter natural response for input signal vector $X_t$. For a look-ahead depth of M, the input signal vector $X_t$ is defined in FIG. 2 and Table 1. The elements of the natural response vector SNAT$_t$ are $C_{X0}$, $C_{X1}$, ..., and $C_{X(M-1)}$, where $C_{X0}$ is the natural response of filter 504 to input signal x(n) at time t, $C_{X1}$ is the natural response of filter 504 to input signal x(n+1) at time t, ..., $C_{X(M-1)}$ is the natural response of filter 504 to input signal x(n+M-1) at time t.

Filter output vector $C_i$ represents the response of loop filter 504 and equals the input signal natural response SNAT minus the forced pattern response SPAT for output candidate vector $Y_i$, "i" is an element of the set {0, 1, ..., N-1}. Other vectors that approximate the output candidate vector $Y_i$ can also be used to determine the forced pattern response SPAT. The minus sign in the summation operation 510 is due to the convention used herein of assuming that the SPAT patterns are the result of applying feedback candidate vectors with a positive sign at the filter input, and that the filter 504 utilizes a negative sign in the operating structure. This convention allows for the search to be considered as one of minimum distance between SNAT and the set of SPATs. In at least one embodiment, the loop filter 504 is chosen to optimize the noise shaping transfer function, and noise shaping loop filter 202 is an example. Loop filter 504 can be implemented using hardware, software, firmware, or any combination of two or more of the foregoing.

For each time t, the quantizer 502 uses a set of the filter output vectors $C_i$ to quantize the input signal vector $X_t$ and determine the quantization output data y(n) for input signal sample x(n). The best match generator 506 searches for the best match between the input signal natural response SNAT$_t$ and the forced pattern responses SPAT, and output selection module 508 chooses the value for output data y(n). "Best" can be defined as closest matching in the signal band of interest. "Closest matching" can be predefined, for example, in a power sense (lowest distance), in a weighted distance sense, in a minimum/maximum sense, in a psycho-acoustically weighted sense, or in another desired measure. A "signal band of interest" is, for example, a frequency band containing a signal with data of interest. For example, an audio signal band of interest is approximately 0 Hz to 25 kHz. Thus, in one embodiment, the "best" output signal pattern Y[n] is the pattern Y[n] such that the loop filter output response $C_i$ has the lowest power. Determining the loop filter output response with the lowest signal power $C_{i\ min}$ and choosing the output data y(n) are illustratively described in more detail in the Melanson II Patent and in commonly assigned U.S. patent application Ser. No. 10/875, 920, now U.S. Pat. No. 6,879,275, entitled "Signal Processing with a Look-ahead Modulator Having Time Weighted Error Values", filed on Jun. 22, 2004, and inventor John L. Melanson (referred to herein as the "Melanson III Patent"). The signal processing system described herein can be adapted to determine the best, closest matching output signal pattern under varying constraints and is not limited to the constraints of "best" and "closest matching" set forth herein, but rather the constraints can be defined to accomplish desired goals. Additionally, it is not necessary to only select the output for one sample per search, two or more samples may be selected, and the filter advanced appropriately for that number of samples.

Figure 6:
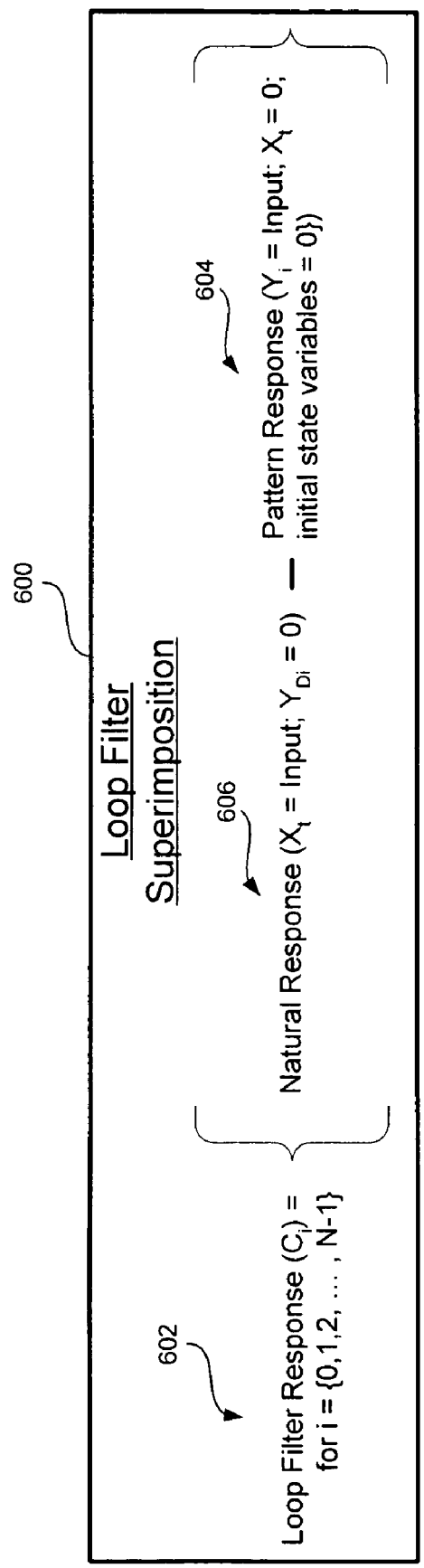
FIG. 6 depicts the superposition of a loop filter response.

FIG. 6 depicts the superposition 600 of the loop filter response $C_i$ 602 for each output candidate vector $Y_i$ and each input signal $X_t$. In one embodiment, the set of all forced pattern responses SPAT 604 represents the set of all loop filter 504 responses for each output candidate vector $Y_i$. As described in more detail below, calculation of some of the forced pattern responses produce duplicate calculations in determining output data y(n). Duplicate calculations can be eliminated. Additionally, some forced pattern responses cannot lead to results that will meet predetermined 'best match' criteria between the natural and forced pattern responses and, thus, also do not have to be considered. Accordingly, "i" can be an element of a subset of the set {0, 1, ..., N-1}. The forced pattern response for each respective output candidate vector $Y_i$ can be determined by setting the input signal vector $X_t$ to at least approximately zero (0), setting the initial state variables of loop filter 504 to at least approximately zero (0), and determining the loop filter forced pattern response SPAT$_i$. Because the forced pattern responses are independent of the input signal data values, the forced pattern response SPAT can be precomputed once and stored for continual use in determining output value y(n). Precomputing the forced pattern responses once and reusing the precomputed responses reduces the amount of computations used to determine y(n). In a circuit implementation, storing precomputed responses in a memory reduces the quantity of circuitry needed to quantize the input signal $X_t$.

The superposition 600 of loop filter response $C_i$ 602 also includes the natural response of loop filter 504 to each input signal vector $X_t$, t={0, 1, ..., T-1} for all operational time T. The input signal natural response SNAT$_t$ is determined by quantizer 500 once for each input signal vector $X_t$ by setting the feedback in loop filter 504 to at least approximately zero (0) and determining the filter 504 response to input signal vector $X_t$.

Figures 6A, 6B:
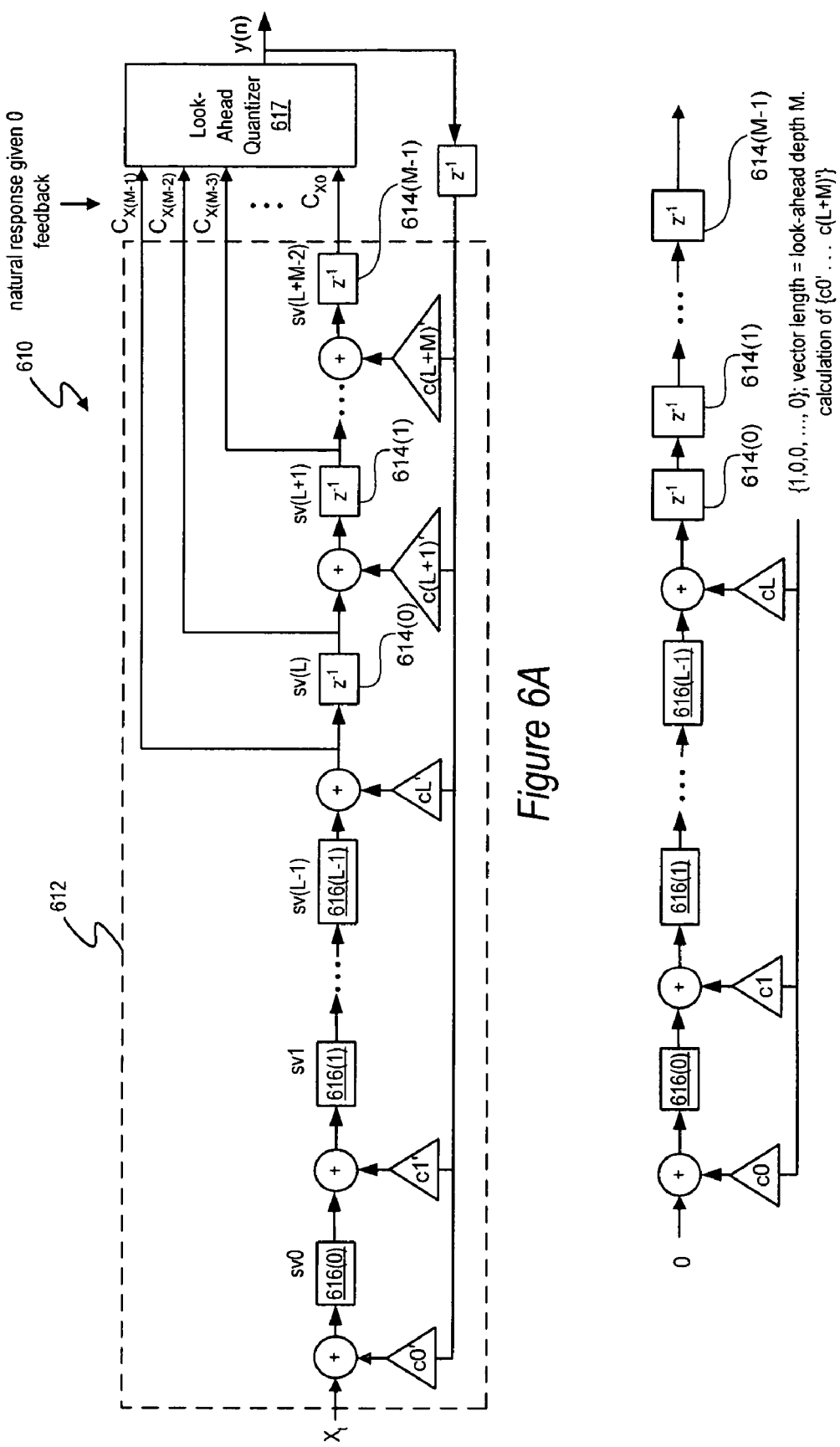
FIGS. 6A–6I depict the design and implementation of an infinite impulse response filter for look-ahead delta sigma modulators with multiple look-ahead outputs.

FIG. 6A depicts a look-ahead delta sigma modulator 610 having an $L^{th}$ order multiple output lookahead IIR filter 612, where L is an integer greater than one. The multiple output lookahead IIR filter 612 represents one embodiment of filter 504. The particular topology of each stage of multiple output lookahead IIR filter 612 is a matter of design choice as well as operations to set the particular frequency response of multiple output lookahead IIR filter 612. An exemplary topology for each stage 616(0), 616(1), . . . , 616(L−1) is $[z^{-1}/(1-z^{-1})]$. State variables $sv_0, sv_1, \ldots, sv_L$ represent the state variables of respective stages 616(0), 616(1), . . . , 616(L−1) are associated with each stage of multiple output lookahead IIR filter 612. M−1 look-ahead response delay stages 614(0), 614(1), . . . , 614(M−1) follow the last stage 616(L−1) of multiple output lookahead IIR filter 612. The state variables $SV_L, SV_{(L+1)}, \ldots, SV_{(L+M)}$ of delay stages 614(0), 614(1), . . . , 614(M−1) respectively represent the natural responses $C_{X(M-1)}, C_{X(M-2)}, \ldots, C_{X0}$ of multiple output lookahead IIR filter 612 when feedback from look-ahead quantizer 617 equals at least approximately zero (0). Thus, the multiple output lookahead IIR filter 612 can generate natural response vector $SNAT_t$ directly for state variables of integral stages, i.e. stages which are a part of look-ahead IIR filter 612. At least one embodiment of the IIR filter 612 is a memoryless, linear time invariant system. The IIR filter 612 conducts a memory-less operation by storing updated states in a memory and retrieving the updated states from memory once during determination of current and future response elements of a natural response vector. Thus, the IIR filter 612 does not save states or multiple copies of state variables during determination of current and future response elements of a natural response vector. Multiple output lookahead IIR filter 612 produces the M look-ahead natural responses by conducting a memory-less operation by not saving states or multiple copies of state variables during determination of current and future response elements of a natural response vector thus reducing memory storage requirements, reducing memory operations, and reducing the number of mathematical computations associated with conventional loop filters used in look-ahead delta sigma modulators. Additionally, multiple output lookahead IIR filter 612 can be scaled to produce less than M natural responses $C_{Xi}$ by reducing the number of look-ahead delay stages following stage 616(L−1). For example, if the look-ahead delay stages are reduced by ½, multiple output lookahead IIR filter 612 can integrally produce ½ of the natural look-ahead responses in one operation and the other ½ in another operation.

In one embodiment, the look-ahead quantizer 616 determines the actual delta sigma modulator output y(n) in accordance with exemplary look-ahead delta sigma modulator quantization process 700. Once an actual quantizer output y(n) is selected, the actual input x(n) and output y(n−1) are applied to multiple output lookahead IIR filter 612 to update the state variables of multiple output lookahead IIR filter 612. Subsequently, multiple output lookahead IIR filter 612 determines the natural response vector $SNAT_{t+1}$ for the next input vector $X_{t+1}$.

The feedback coefficients used in the look-ahead filter can be derived from the prototype filter by simple arithmetic as depicted in FIG. 6B. The modified filter is reset to 0 and presented with a 0 input. The feedback is stimulated with the vector {1,0, . . . ,0} to advance the state of the filter, where the total vector length is the look-ahead depth M. The resulting values in the state variables sv0, sv1, . . . , sv(L+M) are then the values to be used for the new feedback coefficients, c0', c1', c2', . . . , c(L+M)' This value is pre-calculated and requires no run time computation.

Figure 6C:
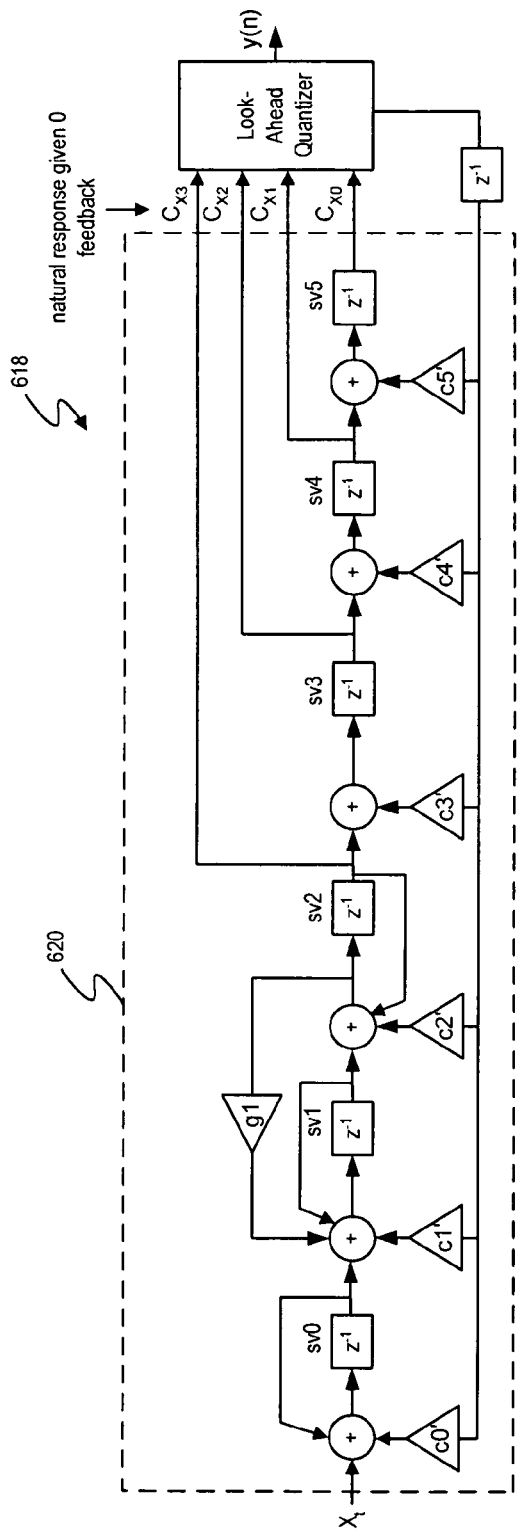
Figure 6D:
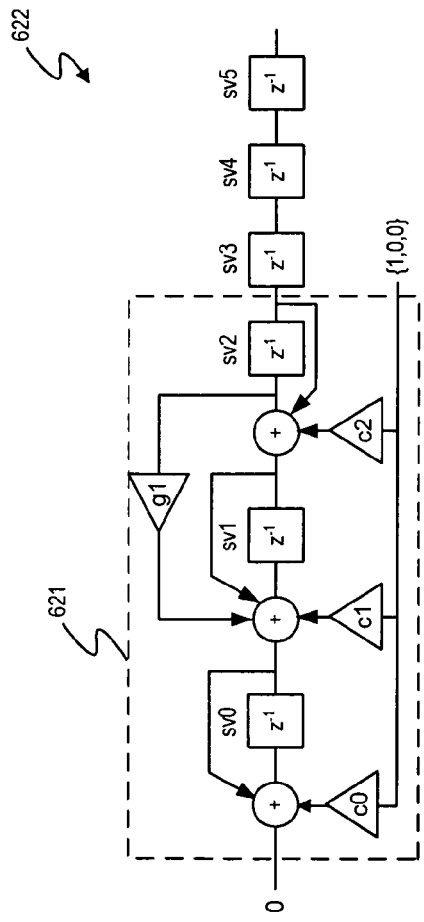

FIG. 6C depicts a look-ahead delta-sigma modulator 618 having a third order multiple output lookahead IIR filter 620 and a look-ahead depth of M=4. The look-ahead delta sigma modulator 618 represents one embodiment of look-ahead delta sigma modulator 610. The multiple output lookahead IIR filter 620 provides one embodiment of the low computation, low memory multiple output lookahead IIR filter 612 for calculation of the future state variables $sv_3$, $sv_4$, and $sv_5$. State variables sv3, sv4, and sv5 represent the natural response vector $SNAT_t$ when feedback y(n)=0. For a third order filter and a look-ahead depth of M=4, multiple output lookahead IIR filter 620 uses a very modest state variable storage of 6 states and, in one embodiment, conducts a memory-less operation by not saving states or multiple copies of state variables during determination of current and future response elements of a natural response vector. Relative to conventional loop filters used in conventional lookahead delta sigma modulators, the multiple output lookahead IIR filter 620 exhibits a lower number of computations and uses less memory, especially in conjunction with the superposition operations used to determine the look-ahead delta sigma modulator outputs y(n).

Figure 4A:
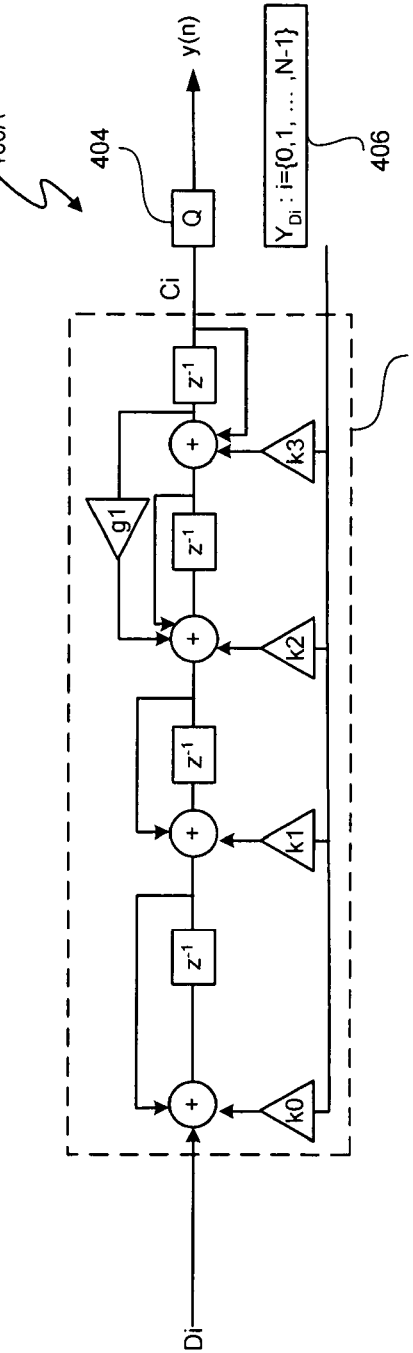
FIG. 4A (labeled prior art) depicts a delta sigma modulator with a fourth order noise shaping loop filter.
Figure 4B:
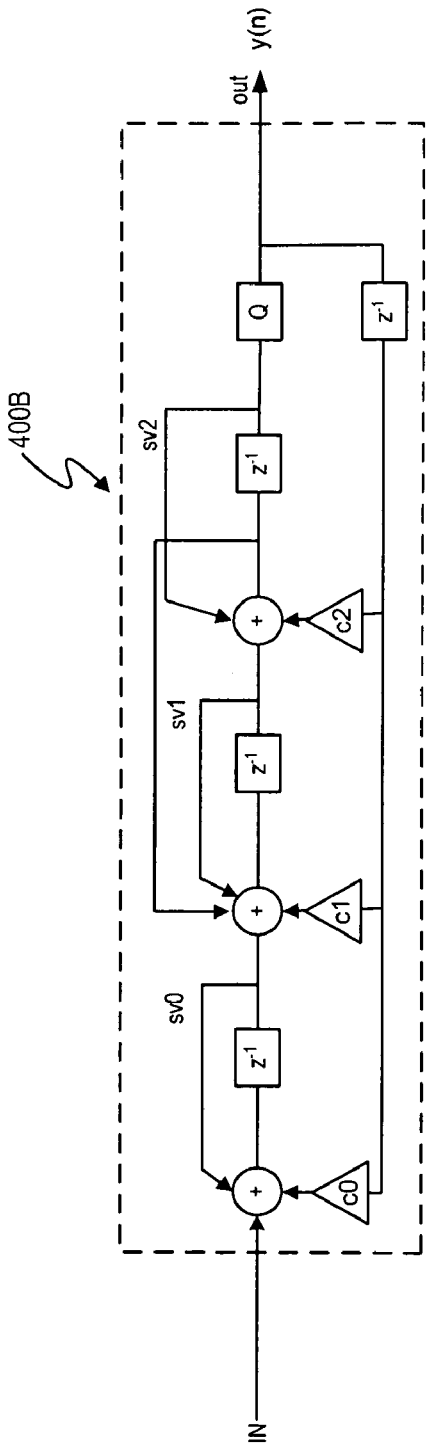
FIG. 4B (labeled prior art) depicts a third order infinite impulse response (IIR) filter.
Figure 4D:
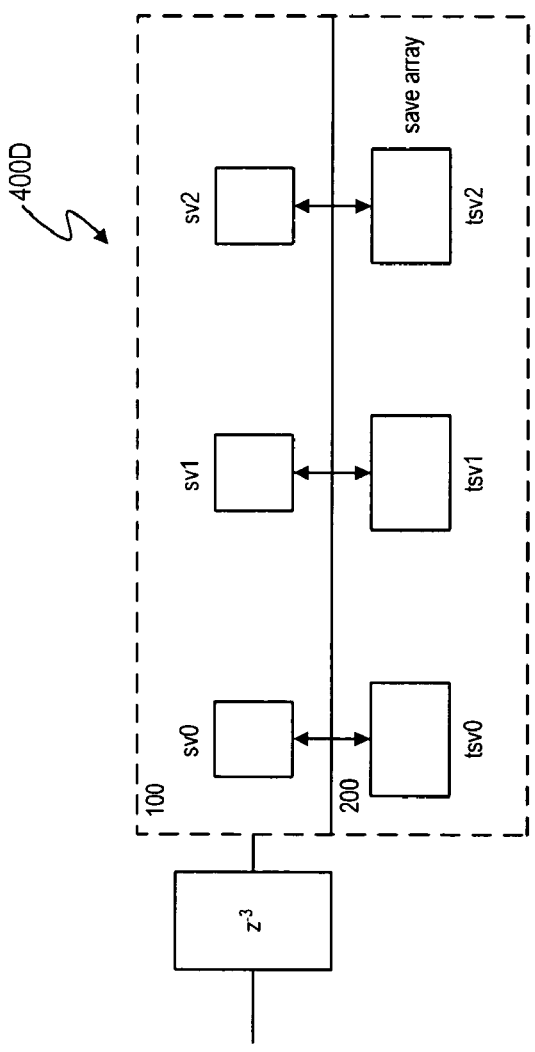
FIG. 4D (labeled prior art) depicts state variable memory operations for the IIR filter of FIG. 4B.
Figure 4C:
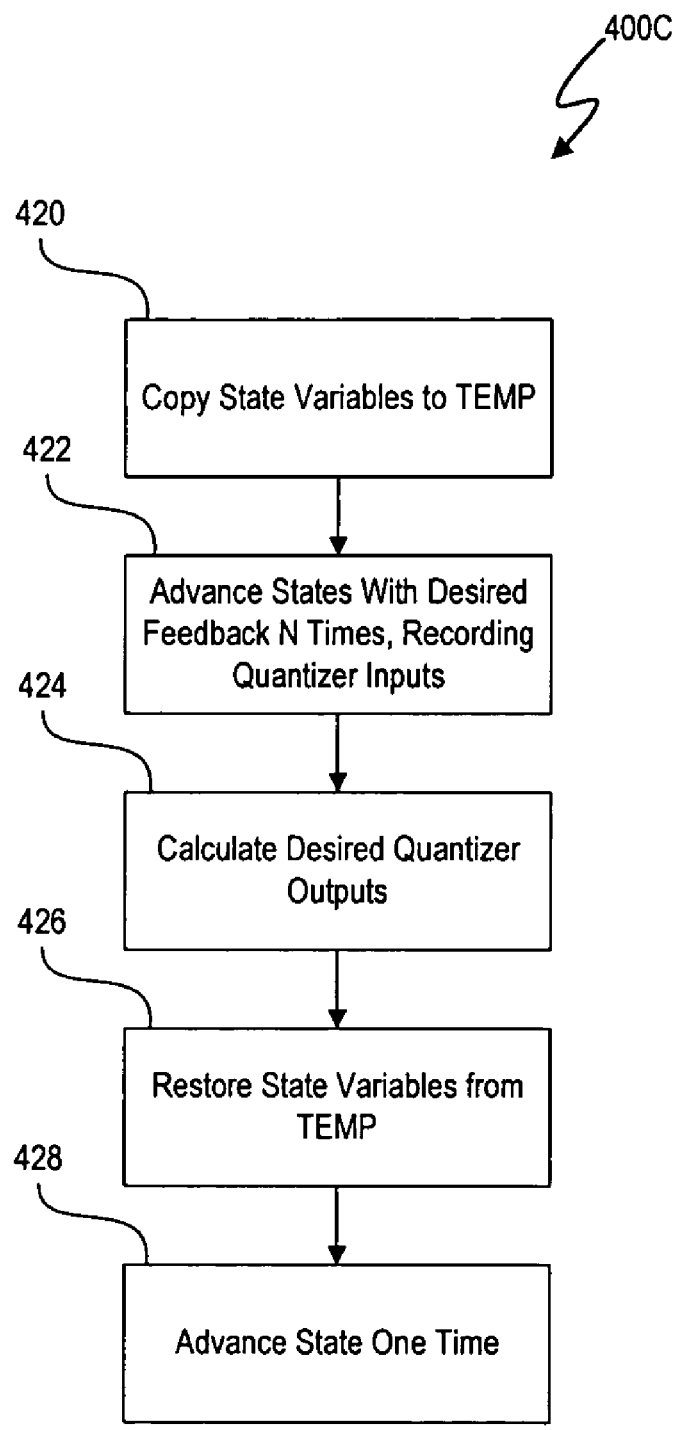
FIG. 4C (labeled prior art) depicts a technique to implement an IIR filter adapted for look-ahead operations.

In one embodiment, after each actual delta sigma modulator output y(n) is chosen by quantizer 622, state variables sv0, sv1, sv2 are updated using actual input x(n) and actual feedback y(n−1) in a manner equivalent to that of FIG. 4B, with different feedback coefficients c0', c1', . . . , c5' used. State variables sv3, sv4, sv5 form a simple delay line from state variable sv2, with feedback corrections added. The value of state variable sv5 is equivalent to the value in sv0 of FIG. 4B; in other words, the feedback coefficients are calculated in such a way as to form the same transfer function. State variable sv4 is the output of the filter, under the assumption that the next feedback value will be 0. Similarly, state variable sv3 is advanced by two time steps, and sv2 by three time steps.

Figure 6E:
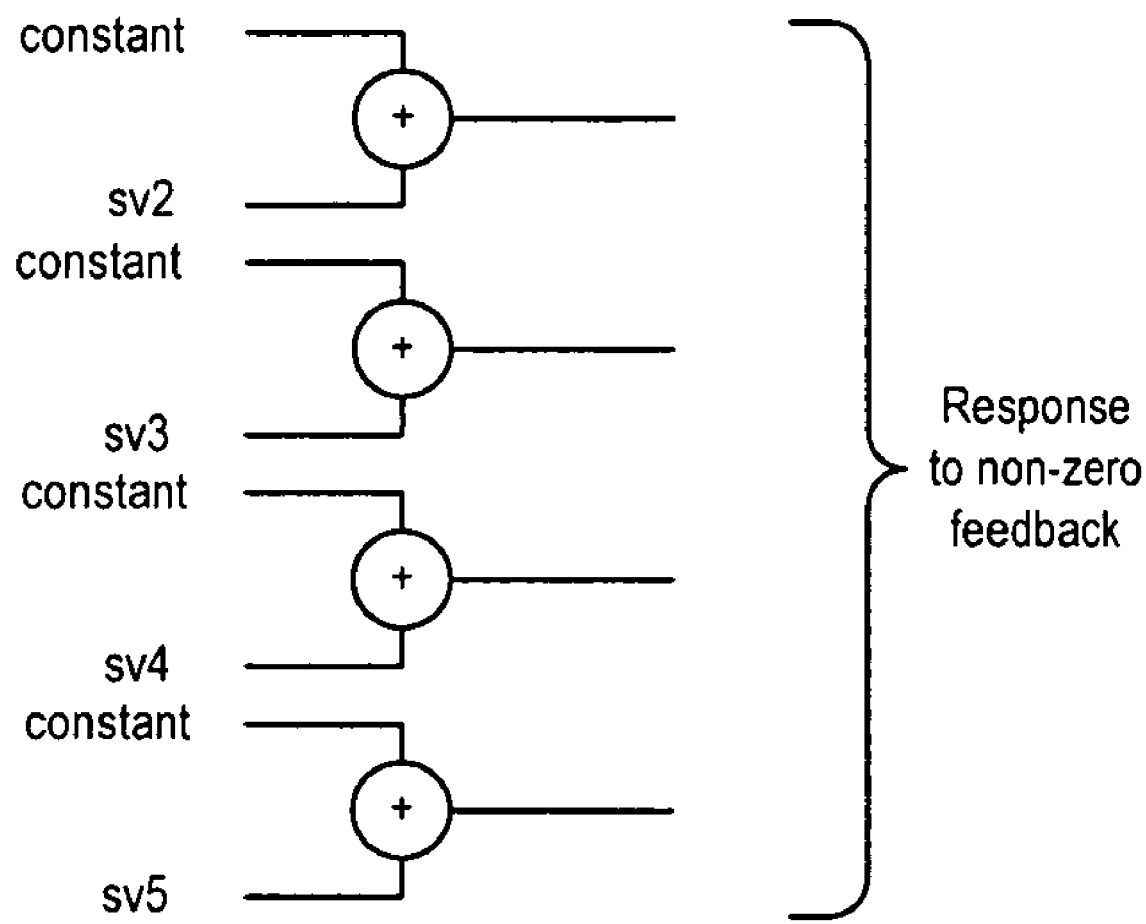

The feedback coefficients c0', c1', . . . , c5' used in the look-ahead filter can be derived from the prototype filter 621 by simple arithmetic as depicted in FIG. 6B. The filter coefficients c0', c1', . . . , c5' are determined as a matter of design choice to establish filter characteristics as if the last 3 delay stages for the current and future state variables did not exist. The state variables of modified filter 622, i.e. an multiple output lookahead IIR filter 622, are reset to 0 and presented with a 0 input. The feedback is stimulated with the vector {1,0,0} to advance state, where the total vector length is the look-ahead depth M. The resulting values in the state variables sv0, sv1, . . . , sv5 are then the values to be used for the new feedback coefficients, c0', c1', . . . , c5'. Again, the feedback coefficients are pre-calculated and require no run time computation as shown in FIG. 6E.

Figure 6F:
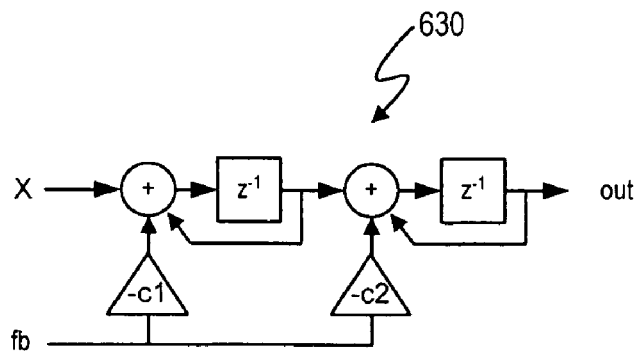

Filter 630 in FIG. 6F depicts an example of the filter transformation from a prototype IIR filter 630 to an multiple output IIR filter 632. Filter 630 can be used in a 2nd order delta-sigma modulator with an all-pole STF. Hx(z) represents the response of the filter 630 to the input terminal, and Hfb(z) represents the response of the filter 630 to the feedback terminal.

Figure 6G:
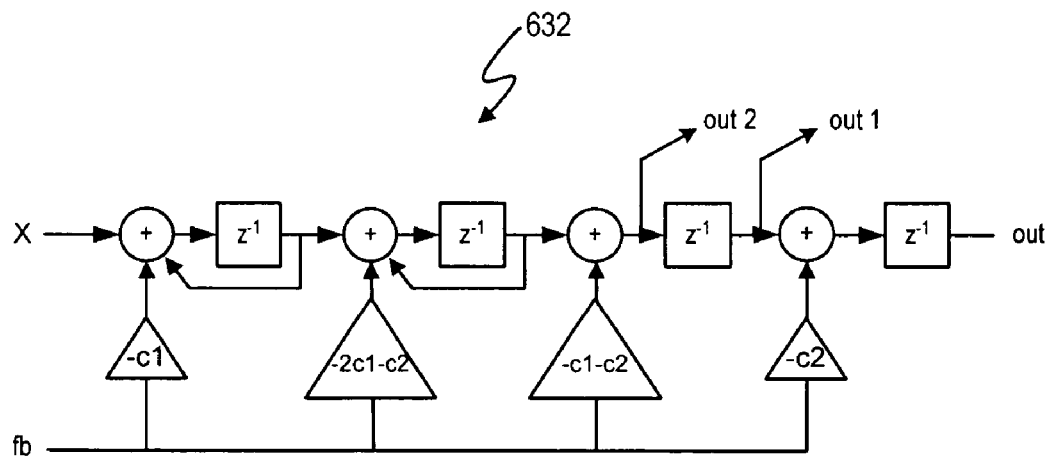

FIG. 6G depicts filter 632 with the same response Hfb(z) as filter 630, but with the advantage of having two other outputs, out1 and out2. Output out1 is the next output out of the filter 632, assuming 0 feedback for the current sample. Similarly, output out2 is advanced by two time steps. The STF of filter 632 differs from the STF of filter 630 by $z^{-2}$, or a delay of 2. This delay can be ignored in many cases (the actual signal delay is often of no interest) or the input can be advanced by two samples. Outputs out, out1, and out2 respectively represent $C_{x2}$, $C_{x1}$, and $C_{x0}$ of the natural response vector $SNAT_t$ for delta sigma modulator 634.

Figure 6H:
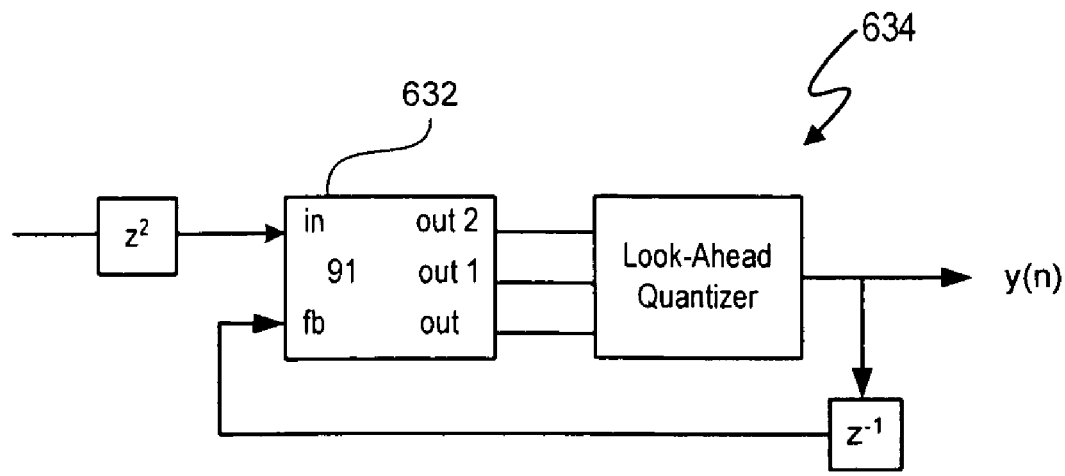

FIG. 6H depicts the use of filter 632 in a lookahead delta sigma modulator 634 having a depth of 2. A compensating advance in the signal input for a current and future input signal sample is shown as $z^2$.

Figure 6I:
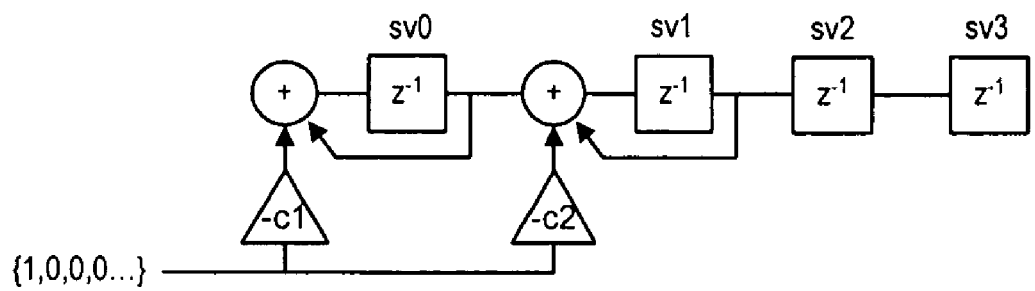

FIG. 6I depicts the generation of new coefficients for filter 632. The additional delays are inserted at the end of filter 630, and an impulse applied to the feedback terminal. Time is advanced by (1+look-ahead depth) cycles, and the final state variable values are recorded as the new filter's feedback coefficients. The resulting filter has the same feedback transfer function as the feedback transfer function of filter 630, with the future output values now available. If c1=1 and c2=2, filter 632 represents a feedback filter for a second order delta-sigma modulator having a NTF of $(1-z\hat{\,}-1)\hat{\,}2$. The mapped coefficients would be {−, −4, −3, −2}.

The design and implementation principles described and depicted in FIGS. 6A–6I can be extended to look-ahead delta sigma modulator filters of any depth M.

Figure 7:
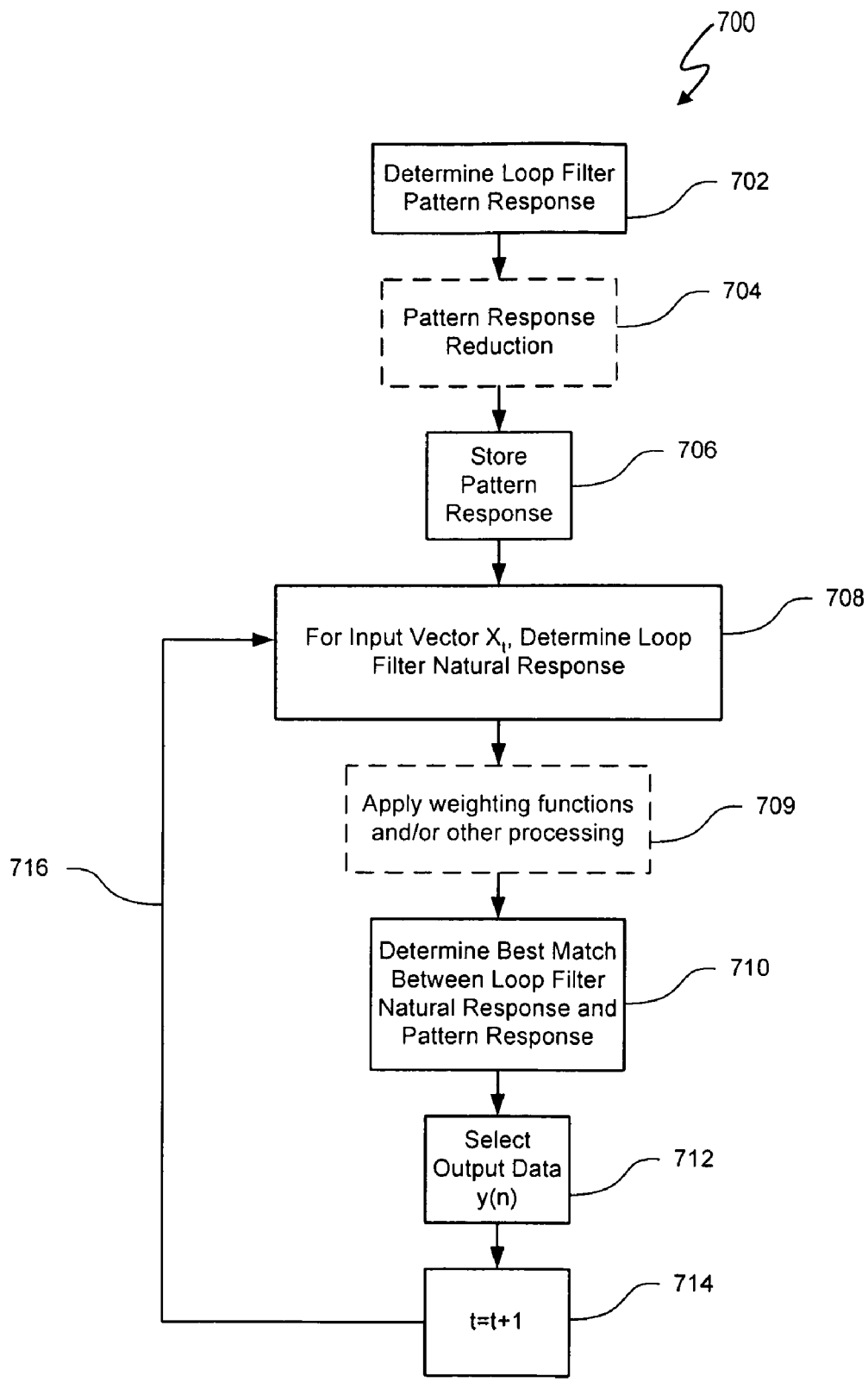
FIG. 7 depicts a look-ahead delta sigma modulator quantization process.

FIG. 7 depicts an illustrative look-ahead delta sigma modulator quantization process 700 using pattern and natural response to quantize input signal X. Quantization process 700 can be implemented in hardware, software, firmware, or any combination of two or more of the foregoing. Process 700 determines the forced pattern responses SPAT for each output candidate vector $Y_i$ as described above. In one embodiment shown in operation 702, a forced pattern response is computed for each $Y_i$, i={1, 2, . . . , N−1}. In another embodiment, some of the forced pattern responses produce duplicate results. Operation 704 indicates that the redundant information in the forced pattern responses does not need to be stored. As an example, the response to {+1,+1,−1,−1} is the arithmetic inverse of the response to {−1,−1,+1,+1}. Additionally, the responses to {+1,+1,−1,−1} and {+1,+1,−1,−1} have the same three first values. Operation 706 stores the precomputed forced pattern responses for subsequent use with all input signal vectors $X_t$.

Operation 708 determines the natural response $SNAT_t$ for input signal vector $X_t$. Optional operation 709 adds weighting vectors to the loop filter response $C_i$ as, for example, described in the Melanson III Patent. Other processing includes minimizing quantization noise as described in the Melanson II Patent.

Operation 710 determines the best match for each input signal vector $X_t$ between the set of forced pattern responses and the loop filter input signal natural response for $X_t$.

If 'best match' is predefined to mean the minimum loop filter output response power for each input signal vector $X_t$, then the power of each vector $C_i$ is determined for each input signal vector $X_t$. The power of $C_i$ is $C_i^2 = (SNAT_t - SPAT_i)^2 = SNAT_t^2 - 2 \cdot SNAT_t \cdot SPAT_i - SPAT^2$.

For a one-bit look-ahead delta sigma modulator, in operation 712 the quantizer output data y(n) is selected from the leading bit of the output candidate vector $Y_i$ from which the minimum filter response $C_{i\ min}$ was generated. In at least one embodiment, the output data y(n) is the leading bit of the output candidate vector $Y_i$ from which the 'best match' filter response $C_{i\ min}$ was generated. In another embodiment, if a vector V approximating an output candidate vector $Y_i$ is used to determine the minimum filter response $C_{i\ min}$, then the approximated output candidate vector $Y_i$ is associated with the forced pattern response of the vector V, and the output data y(n) is selected as the leading bit of the output candidate vector $Y_i$.

Operation 714 advances quantization process 700 to quantize the next input signal $X_t$ for sample t=t+1 in operation 708. The return path 716 to operation 708 illustrates that the forced pattern responses SPAT, in one embodiment, need only be computed once.

In a binary system, the number of unique output candidate vectors for a depth of M is $2^N$. When determining the best match between the natural response and the forced pattern responses, the number of forced pattern responses considered by best match generator 506 can be reduced to eliminate from consideration any forced pattern responses that provide duplicate outcomes from which to select an output value. For example, as the loop filter is a linear system, the response to −x is the negative of the response to x. This method can be used to eliminate one-half of all pattern responses by pattern response reduction 704. For example, when depth M =4, two of the output candidate vectors are $Y_0$=[−1, −1, −1, −1] and $Y_{15}$=[+1, +1, +1, +1]. $SPAT_0$, corresponding to the loop filter response to output candidate vector $Y_0$, and $SPAT_{15}$, corresponding to the loop filter response to output candidate vector $Y_{15}$, are arithmetic inverses.

Further simplification of the quantization calculations can be achieved by eliminating calculations that have no impact when determining the best match between the loop filter input signal natural response $SNAT_t$ and the loop filter pattern responses SPAT. This reduction can be based on arithmetic identities. When the predetermined best match criteria identifies the minimum loop filter response output power, $C_{i\ min}^2 = [(SNAT_t - SPAT_i)^2 = SNAT_t^2 - 2 \cdot SNAT_t \cdot SPAT_i - SPAT_i^2]_{min}$, $SNAT_t^2$ is a constant for all $C_i$, and, thus has no effect on determining $C_{i\ min}^2$ and can be eliminated from the minimum power computation. Furthermore, $SPAT_i^2$ is a constant for each pattern response, and can, thus, be precomputed and stored in a memory and recalled for the power calculation. The "2" multiplier in "$2 \cdot SNAT_t \cdot SPAT_i$" need not be included in the power calculation because doubling $SNAT_t \cdot SPAT_i$ has no effect on determining $C_{i\ min}^2$. (although the precomputed $SPAT_i^2$ values are scaled by ½). Thus, the calculations of $C_i^2$ can be significantly simplified by eliminating calculations that will not affect $C_{i\ min}^2$. The computation now consists of a vector dot product (sum of products) and the addition of a constant.

Figure 8:
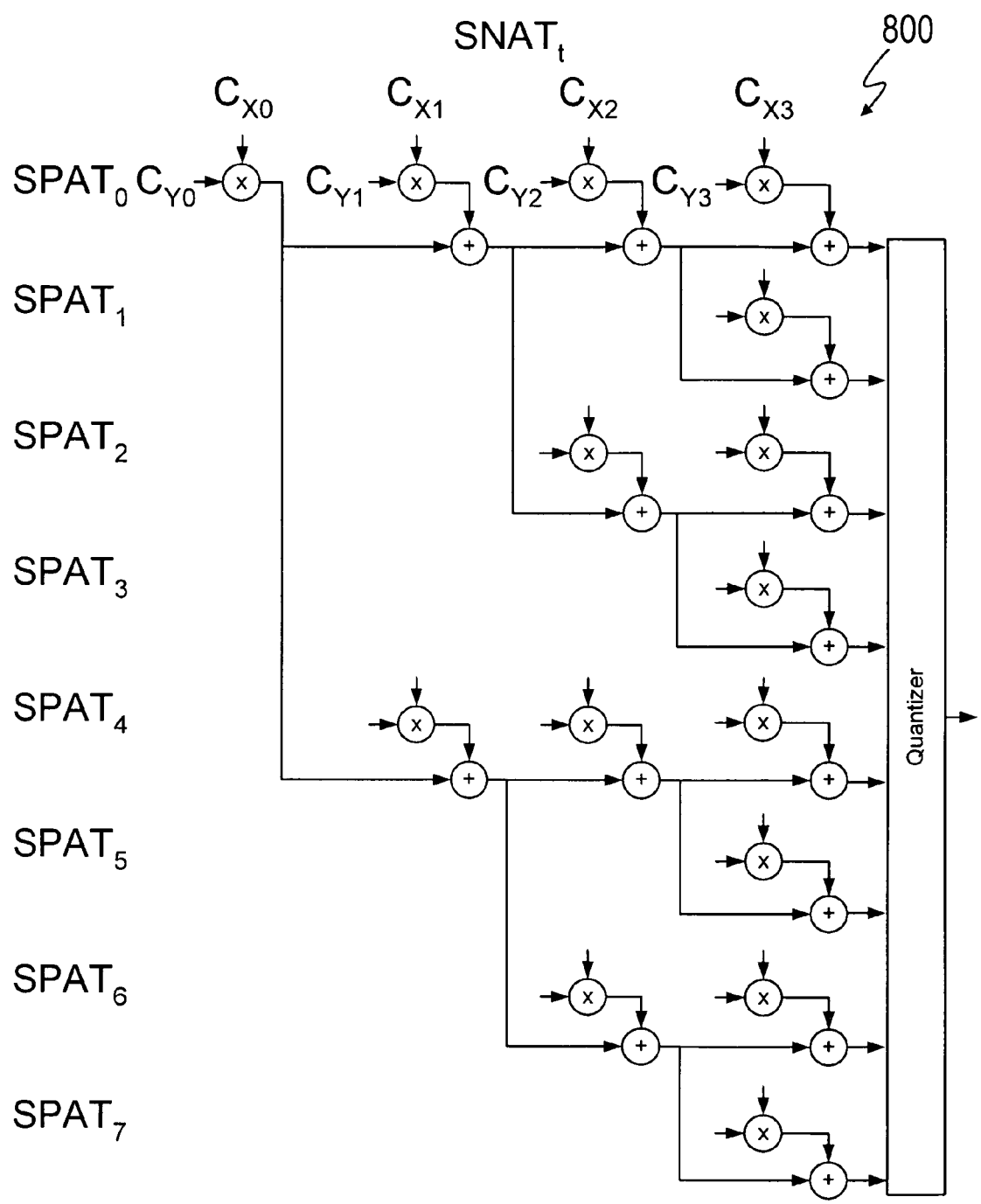
FIG. 8 depicts a computation reduction scheme.

FIG. 8 schematically depicts a computation reduction scheme 800 that reduces the number of computations used to select an output value in a look-ahead delta sigma modulator. Quantization computations can be further reduced by performing otherwise repetitive calculations only once. For all sets of $SPAT_i$, there are only two (2) values for the first element, four (4) for the second element, etc. This insight can be demonstrated in a straight forward manner, as there are only two possible values for the first element (−1, +1) of the $SPAT_i$ vector, hence only two possible filter responses. Similarly, there are only 4 possible values for the first two elements of the feedback. These multiplications can be shared across all ½, ¼, etc. of the total computations. This sharing reduces computation by ½. Together with the −/+anti-symmetry of the total pattern, the computation is reduced by a factor of 4. Repetitive additions can also be shared to further reduce the number of computations. The reduction scheme depicts computation reduction for a depth of 4 and can be easily extended using the same pattern as depicted in FIG. 8 for a look-ahead depth of M.

Computation reduction scheme 800 includes multipliers represented by "" and adders represented by "". $C_{X0}$, $C_{X1}$, $C_{X2}$, and $C_{X3}$ are the output values of filter 504 represented by vector $SNAT_t$ for time "t". $SPAT_0$ through $SPAT_7$ are respectively the output values of the eight output candidate vectors, $Y_0$ through $Y_7$. $SPAT_0$ through $SPAT_7$ all have anti-symmetry counterparts and, thus, are not needed to calculate the output value. Additionally, although not depicted in this embodiment, constants and variables can be included in the computations to modify $SPAT_i$. In one embodiment, $SPAT_0$ is the filtered response to $Y_0=\{-1, -1, -1, -1\}$, $SPAT_1$ is the filtered response to $Y_1=\{-1, -1, -1, +1\}$, $SPAT_2$ is the filtered response of $Y_2=\{-1, -1, +1, -1,\}$ and so on with $SPAT_7$ representing the filtered response to $Y_7=\{-1, +1, +1, +1\}$. The computation reduction scheme computes the dot product of SNAT and $SPAT_0$ and sums the result. For the dot product of SNAT and $SPAT_1$, the first three multiplications and additions, i.e. $C_{X0} \times C_{Y0} + C_{X1} \times C_{Y1} + C_{X2} \times C_{Y2}$, are identical for SNAT and $SPAT_0$ and are, thus, not repeated. For the dot product of SNAT and $SPAT_2$, the two multiplications and additions, i.e. $C_{X0} \times C_{Y0} + C_{X1} \times C_{Y1}$, are identical for SNAT and $SPAT_0$ and are, thus, not repeated, and so on. Thus, in general, the number of calculations used to determine the quantizer output can be significantly reduced by not performing redundant multiplications and storing repetitively used summation results. Computation reduction scheme 800 can be modified in any number of ways by, for example, retaining some repetitive calculations to reduce memory recall operations.

One embodiment of C++ code to perform one embodiment of the functions depicted by look-ahead delta sigma modulator 1000 follows:

```
///////////////////////////////////////////////
///////////////////////////////////////////////
//
//      Main delta sigma modulator- floating point
//      With look-ahead for best windowed quantization error
//
///////////////////////////////////////////////
///////////////////////////////////////////////
class sd9{                      // 9th order feedback type modulator
double sv[32],aheadcoef[32];
static double coef[9],g1[4];    // Coefficients for filter
static int sumsq[32768];        // Pre-computeded tables for
                                  look-ahead patterns
static double impulse[16][16];
static double weight[12][12];   // Window functions
int npat,leftbit;               // 2^depth, 2^(depth-1)
int depthm4;                    // how far to search for overflow peak
int order, lastsv;
double im[10],iscale;           // Monitor of max value of
                                  integrators (diagnostic)
double target;     // Set to one for a unity loop gain target
int prev;
// local functions
inline int sd9::quanttr(void);   // The look-ahead code is here
inline int sd9::quanttr16(void); // Same, uses factoring by 16
inline void crank(int q);
inline void crank(double in, int q);
public:
void sdreset(void);              // for startup of modulator
void prmax(void);                // print out of integrator max values
void sd(double in, double *out); // Actual modulator
void prstat(void);
int stats[4096][2];
};
double sd9::coef[9]=
// 65 k
{1.8618491415267613e-8, 7.676226899625688e-7,
0.00001721142114819406, 0.0002283476092014118,
0.002308029617862667, 0.016446123359991294,
0.08888632748972247, 0.33739883882758015, 0.8286652332985049};
// Local resonator gains
double sd9::g1[4]={-.00023, -.00085, -.0015, -.0020};
// For tapered weighting of the near vs later in time samples
double sd9::weight[12][12]={
    {1.0, 0.0, 0.0, 0.0, 0.0, 0.0, 0.0, 0.0, 0.0, 0.0, 0.0, 0.0},
    {2.0, 1.0, 0.0, 0.0, 0.0, 0.0, 0.0, 0.0, 0.0, 0.0, 0.0, 0.0},
    {2.0, 2.0, 1.0, 0.0, 0.0, 0.0, 0.0, 0.0, 0.0, 0.0, 0.0, 0.0}, //3
    {2.0, 2.0, 2.0, 1.0, 0.0, 0.0, 0.0, 0.0, 0.0, 0.0, 0.0, 0.0}, //4
    {4.0, 4.0, 3.0, 2.0, 1.0, 0.0, 0.0, 0.0, 0.0, 0.0, 0.0, 0.0}, //5
    {1.0, 1.0, 1.0, 1.0, 1.0, 1.0, 1.0, 1.0, 0.0, 0.0, 0.0, 0.0}, //6
    {4.5, 4.5, 4.5, 4.0, 3.0, 2.0, 1.0, 0.0, 0.0, 0.0, 0.0, 0.0}, //7
    {5.0, 5.0, 5.0, 5.0, 4.0, 3.5, 2.5, 1.2, 0.0, 0.0, 0.0, 0.0}, //8
    {7.0, 7.0, 7.0, 6.0, 5.0, 4.0, 3.0, 2.0, 1.0, 0.0, 0.0, 0.0}, //9
    {5.0, 5.0, 5.0, 5.0, 4.6, 4.0, 3.5, 2.6, 1.2, 0.0, 0.0}, //10
    {7.0, 7.0, 7.0, 7.0, 7.0, 6.0, 5.0, 4.0, 3.0, 2.0, 1.0, 0.0}, //11
    {5.0, 5.0, 5.0, 5.0, 5.0, 5.0, 5.0, 4.5, 4.0, 3.5, 2.5, 1.5}}; //12
double sd9::impulse[16][16];
int sd9::sumsq[32768];           // Weighted sum of squares of above
// crank - turn the time crank one step in the filter
//
// This version calculates the current and future outputs simultaneously
//
inline void sd9::crank(double in, int q){
    for(int i=lastsv;i>=order;i--)sv[i]=sv[i-1];
    sv[8]+=sv[7]               ;
    sv[7]+=sv[6] + sv[8]*g1[3];
    sv[6]+=sv[5]               ;
    sv[5]+=sv[4] + sv[6]*g1[2];
    sv[4]+=sv[3]               ;
    sv[3]+=sv[2] + sv[4]*g1[1];
    sv[2]+=sv[1]               ;
    sv[1]+=sv[0] + sv[2]*g1[0];
    sv[0]+=in;
    if(q>0)for(i=0;i<=lastsv;i++)sv[i]+=aheadcoef[i];
    else for(i=0;i<=lastsv;i++)sv[i]-=aheadcoef[i];
};
// This version acts like the original prototype filter
// and is used only to calculate constants
inline void sd9::crank(int q){
    sv[8]+=sv[7] - coef[8]*q              ;
    sv[7]+=sv[6] - coef[7]*q + sv[8]*g1[3];
    sv[6]+=sv[5] - coef[6]*q              ;
    sv[5]+=sv[4] - coef[5]*q + sv[6]*g1[2];
    sv[4]+=sv[3] - coef[4]*q              ;
    sv[3]+=sv[2] - coef[3]*q + sv[4]*g1[1];
    sv[2]+=sv[1] - coef[2]*q              ;
    sv[1]+=sv[0] - coef[1]*q + sv[2]*g1[0];
    sv[0]+= - coef[0]*q;
};
void sd9::sdreset(void){
    int i,j,pat,q;
    iscale=coef[0]*.5;
    order=9;lastsv=order-2+depth;depthm4=depth-4;
    for(i=0;i<10;i++)im[i]=0;
    npat=1<<depth;leftbit=npat/2;
    target=1.;prev=0;
//
// Pre-compute the 2^depth pattern responses
// For each possible pattern,
// Set all of the state variables to 0
// Input the pattern as feedback, with an input of 0. Record
the filter outputs
//
    for(pat=0;pat<npat;pat++){
        for(i=0;i<=lastsv;i++)sv[i]=0;
        sumsq[pat]=0;
        for(i=0;i<depth;i++){
            q=(pat & (1<<(depth-1-i)) )?-1:1;
//
// We will use the fact that w(x-y)^2 = wx^2 - 2wxy + wy^2
// As we want the min, wx^2 is a constant that can be removed
// 2wy is stored in vector (per pattern) pats[pat]
// All of the wy^2 are summed into scaler sumsq[pat]
//
            pats[pat][i]=(i8-target*q)*2*weight[depth-1][i]*256;
            sumsq[pat]+=int(floor((sv[8]-target*q)*(sv[8]-target*q)*
weight[depth-1][i]*256));
            crank(q);
        }
//      fprintf(os,"%3x ",pat);for(i=0;i<depth;i++)fprintf(os,"
%8.3f",pats[pat][i]);fprintf(os,"\n");
    }
//
```

```
// This iteration makes an impulse response,
// and builds array aheadcoef, which maps the filter onto on incorporating
// look ahead.
//
    for(i=0;i<=lastsv;i++)sv[i]=0;
    q=1;
    for(i=0;i<depth;i++){
        for(j=lastsv;j>=order;j--)sv[j]=sv[j-1];
        crank(q);
        q=0;
    }
    for(i=0;i<=lastsv;i++)aheadcoef[i]=sv[i];
    for(i=0;i<depth;i++){
        for(j=0;j<depth;j++){
            impulse[i][j]=0;
            if(j==i)impulse[i][j]=-target*weight[depth-1][j]*2*256;
            if(j>i)impulse[i][j]=sv[order-1+i+depth-j]*
                weight[depth-1][j]*2*256;
        }
    }
//  for(i=0;i<20;i++)fprintf(os," %3d %8.5f\n",i,sv[i]);
    for(i=0;i<32;i++)sv[i]=0;
}
//
// In the quantizer, two simplifications are used.
// Symmetry is invoked, and only the first half of the patterns are looked at
// (the pattern +1 +1 -1 +1 has a pats vector that is the negative
// of -1 -1 +1 -1, while the sunsq is the same)
//
// Additionally, the pats have the same multiplications for early outputs
if the feedback would match
// A tree structure in the correlation takes advantage of this fact.
//
int sd9::quanttr(void){
    int impcor[4096];
    int impdot[12];
    int i,j;
    int qt;
    int stride;
//  int q=i8>0?1:-1; // old style for comparison (non look-ahead)
```

```
    for(i=0;i<depth;i++){
        impdot[i]=0;
        for(j=i;j<depth;j++)impdot[i]+=int(floor(.5+sv[lastsv-j]*
            impulse[i][j]));
    }
    impcor[0]=impdot[0]+impdot[depth-1];
    impcor[1]=impdot[0]-impdot[depth-1];
    int *p1=impcor+2,*p2;
    for(stride=2,i=depth-2;i>0;stride<<=1,i--){
        int tdot=impdot[i];
        for(j=0,p2=impcor;j<stride;j++){
            *p1++ = *p2 -tdot;
            *p2++ +=tdot;
        }
    }
// Now do the search
    int best=999999;
    p1=impcor;p2=sumsq;
    for(i=0;i<leftbit;i++){
        if(*p1>0){
            int t=*p2++ - *p1++;
            if (t<best){best=t;qt=-1;}
        }else{
            int t=*p2++ + *p1++;
            if (t<best){best=t;qt=+1;}
        }
    }
    return qt;
}
void sd9::sd(double in, double *out){
    int q;
/*********************************************
```

Main delta sigma loop –fp in is the next sample to be encoded out points to an output array, where a +–2 is placed This is consistent with the SACD scaling definition, where 50% MI is considered full scale

```
*********************************************/
    int i;
    q=quanttr( );
// do analog part
    *out++=q*2;
    crank(in*iscale,q);
};
//
// Quantizer that does calculation using a final matrix factoring of the adds
// Same result, fewer adds for large depths
int sd9::quanttr16(void){ //only works for depth >=6
        int impcor[4096];
        int impdot[12];
        int i,j;
        int qt;
        int stride;
//      int q=i8>0?1:-1; // old style for comparison (non look-ahead)
        for(i=0;i<depth;i++){
            impdot[i]=0;
            for(j=i;j<depth;j++)impdot[i]+=int(floor(.5+sv[lastsv-
j]*impulse[i][j]));
        }
        impcor[0]=impdot[0]+impdot[depth-5];
        impcor[1]=impdot[0]-impdot[depth-5];
        int *p1=impcor+2,*p2;
        for(stride=2,i=depth-6;i>0;stride<<=1,i--){
            int tdot=impdot[i];
            for(j=0,p2=impcor;j<stride;j++){
                *p1++ = *p2 -tdot;
                *p2++ +=tdot;
            }
        }
```

-continued

```
    int cor0= +impdot[depth-1]+impdot[depth-2]+impdot[depth-3]+impdot[depth-4];
    int cor1= -impdot[depth-1]+impdot[depth-2]+impdot[depth-3]+impdot[depth-4];
    int cor2= +impdot[depth-1]-impdot[depth-2]+impdot[depth-3]+impdot[depth-4];
    int cor3= -impdot[depth-1]-impdot[depth-2]+impdot[depth-3]+impdot[depth-4];
    int cor4= +impdot[depth-1]+impdot[depth-2]-impdot[depth-3]+impdot[depth-4];
    int cor5= -impdot[depth-1]+impdot[depth-2]-impdot[depth-3]+impdot[depth-4];
    int cor6= +impdot[depth-1]-impdot[depth-2]-impdot[depth-3]+impdot[depth-4];
    int cor7= -impdot[depth-1]-impdot[depth-2]-impdot[depth-3]+impdot[depth-4];
    int cor8= +impdot[depth-1]+impdot[depth-2]+impdot[depth-3]-impdot[depth-4];
    int cor9= -impdot[depth-1]+impdot[depth-2]+impdot[depth-3]-impdot[depth-4];
    int cora= +impdot[depth-1]-impdot[depth-2]+impdot[depth-3]-impdot[depth-4];
    int corb= -impdot[depth-1]-impdot[depth-2]+impdot[depth-3]-impdot[depth-4];
    int corc= +impdot[depth-1]+impdot[depth-2]-impdot[depth-3]-impdot[depth-4];
    int cord= -impdot[depth-1]+impdot[depth-2]-impdot[depth-3]-impdot[depth-4];
    int core= +impdot[depth-1]-impdot[depth-2]-impdot[depth-3]-impdot[depth-4];
    int corf= -impdot[depth-1]-impdot[depth-2]-impdot[depth-3]-impdot[depth-4];
// Now do the search
    int best=999999;int t;
    p1=impcor;p2=sumsq;
    for(i=0;i<(leftbit>>4);i++){
        t=*p1+cor0;if(t>0){t=*p2++ - t;if (t<best){best=t;qt=-1;} }else{t=*p2++ + t;if (t<best){best=t;qt=+1;} }
        t=*p1+cor1;if(t>0){t=*p2++ - t;if (t<best){best=t;qt=-1;} }else{t=*p2++ + t;if (t<best){best=t;qt=+1;} }
        t=*p1+cor2;if(t>0){t=*p2++ - t;if (t<best){best=t;qt=-1;} }else{t=*p2++ + t;if (t<best){best=t;qt=+1;} }
        t=*p1+cor3;if(t>0){t=*p2++ - t;if (t<best){best=t;qt=-1;} }else{t=*p2++ + t;if (t<best){best=t;qt=+1;} }
        t=*p1+cor4;if(t>0){t=*p2++ - t;if (t<best){best=t;qt=-1;} }else{t=*p2++ + t;if (t<best){best=t;qt=+1;} }
        t=*p1+cor5;if(t>0){t=*p2++ - t;if (t<best){best=t;qt=-1;} }else{t=*p2++ + t;if (t<best){best=t;qt=+1;} }
        t=*p1+cor6;if(t>0){t=*p2++ - t;if (t<best){best=t;qt=-1;} }else{t=*p2++ + t;if (t<best){best=t;qt=+1;} }
        t=*p1+cor7;if(t>0){t=*p2++ - t;if (t<best){best=t;qt=-1;} }else{t=*p2++ + t;if (t<best){best=t;qt=+1;} }
        t=*p1+cor8;if(t>0){t=*p2++ - t;if (t<best){best=t;qt=-1;} }else{t=*p2++ + t;if (t<best){best=t;qt=+1;} }
        t=*p1+cor9;if(t>0){t=*p2++ - t;if (t<best){best=t;qt=-1;} }else{t=*p2++ + t;if (t<best){best=t;qt=+1;} }
        t=*p1+cora;if(t>0){t=*p2++ - t;if (t<best){best=t;qt=-1;} }else{t=*p2++ + t;if (t<best){best=t;qt=+1;} }
        t=*p1+corb;if(t>0){t=*p2++ - t;if (t<best){best=t;qt=-1;} }else{t=*p2++ + t;if (t<best){best=t;qt=+1;} }
        t=*p1+corc;if(t>0){t=*p2++ - t;if (t<best){best=t;qt=-1;} }else{t=*p2++ + t;if (t<best){best=t;qt=+1;} }
        t=*p1+cord;if(t>0){t=*p2++ - t;if (t<best){best=t;qt=-1;} }else{t=*p2++ + t;if (t<best){best=t;qt=+1;} }
        t=*p1+core;if(t>0){t=*p2++ - t;if (t<best){best=t;qt=-1;} }else{t=*p2++ + t;if (t<best){best=t;qt=+1;} }
        t=*p1+corf;if(t>0){t=*p2++ - t;if (t<best){best=t;qt=-1;} }else{t=*p2++ + t;if (t<best){best=t;qt=+1;} }
        p1++;
    }
    return qt;
}
```

Figure 9:
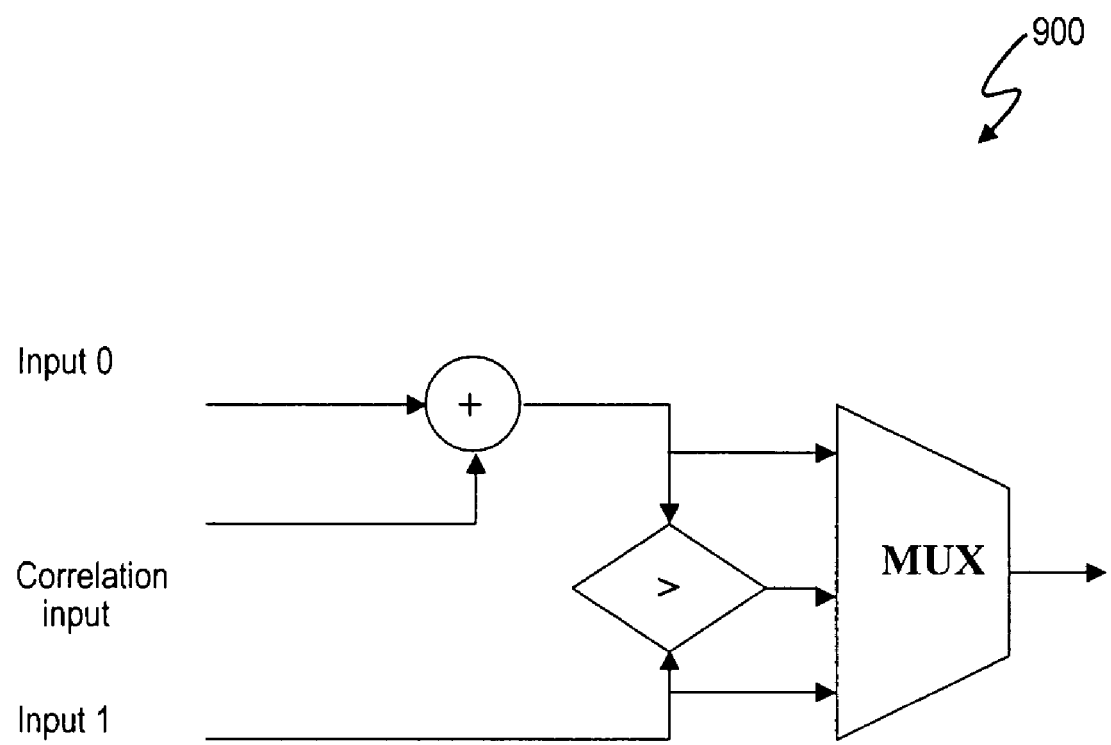
FIG. 9 depicts an add/compare/select network.
Figure 10:
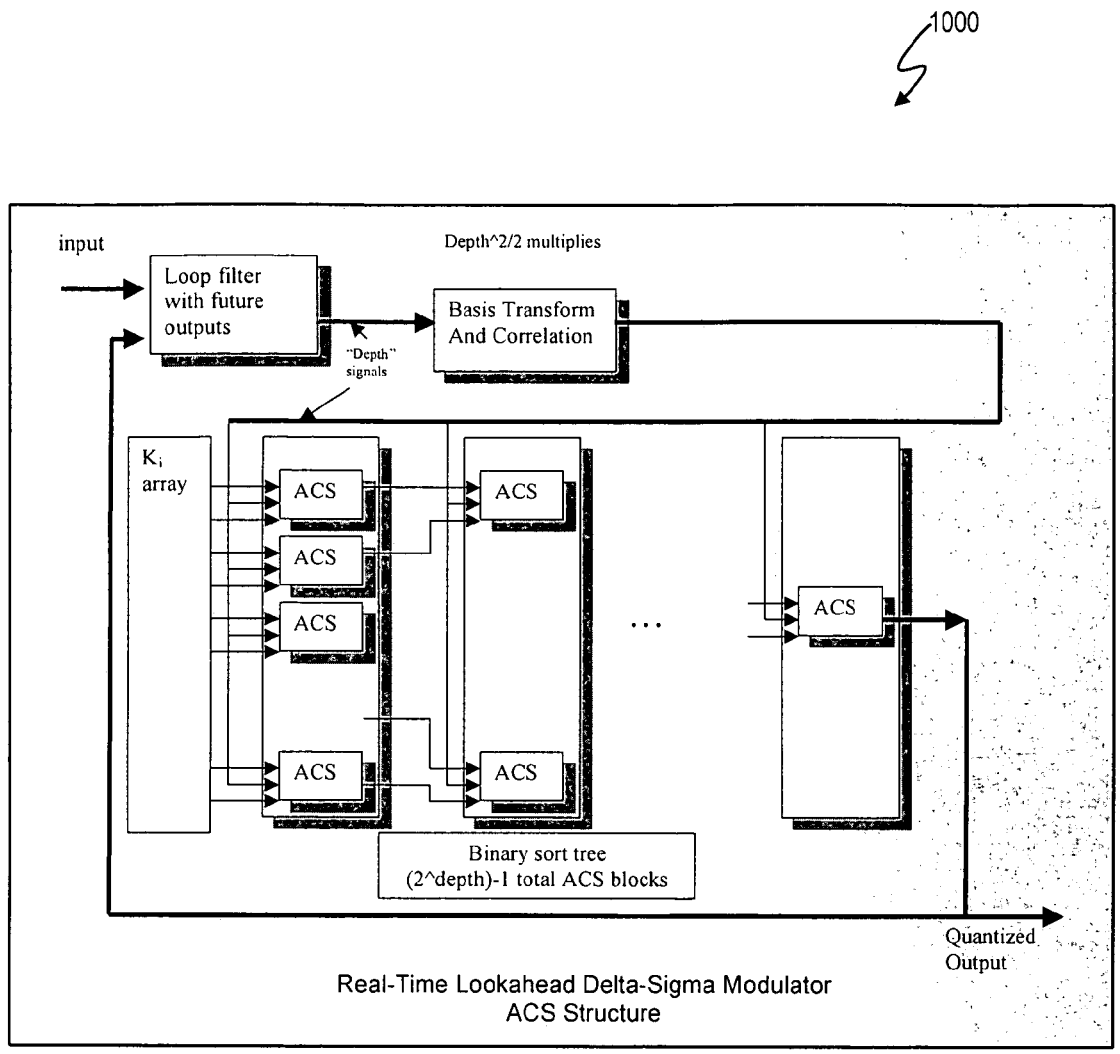
FIG. 10 depicts a look-ahead delta sigma modulator that uses and implements the add/compare/select network of FIG. 9.

An alternate way of computing $SNAT_i \cdot SPAT_i$ using the calculation reduction techniques described above is to use an add/compare/select (ACS) networks 900 such as the network depicted in FIG. 9 in an implementation such as the look-ahead delta sigma modulator 1000 depicted in FIG. 10. Look-ahead delta sigma modulator 1000 represents one embodiment of look-ahead delta sigma modulator 500. Approximately $2^M-1$ ACS 900 networks, arranged in a tree, can implement look-ahead delta sigma modulator 1000.

An example that illustrates the concepts of ACS networks follows. The operation can be understood as follows. Assume a look-ahead depth of 4 (M=4), and:

e0=filter response to {1,0,0,0}
e1=filter response to {0,1,0,0}
e2=filter response to {0,0,1,0}
e3=filter response to {0,0,0,1}

Since the filter is a linear system, it follows that $SPAT_0$=filter response to $\{-1,-1,-1,-1\}$=$-e0-e1-e2-e3$. Defining:

$$f0 = e0 \cdot SNAT$$

$$f1 = e1 \cdot SNAT$$

$$f2 = e2 \cdot SNAT$$

$$f3 = e3 \cdot SNAT$$

Then:

$$SNAT \cdot SPAT_0 = -f0-f1-f2-f3$$

and $SNAT \cdot SPAT_i$ for any "i" can be computed as a simple sum/difference of corresponding f values.

This operation dramatically reduces the computation of multiplications, which are more "expensive" than additions in terms of the number of computations. All cost values are now of the form:

(79) cost 0=k0−f0−f1−f2−f3 cost 1=k1−f0−f1−f2+f3 cost 2=k2−f0−f1+f2−f3 cost 3=k3−f0−f1+f2+f3 cost4=k4−f0+f1−f2−f3 cost5=k5−f0+f1−f2+f3 cost6=k6−f0+f1+f2−f3 cost7=k7−f0+f1+f2+f3 cost8=k8+f0−f1−f2−f3 cost9=k9+f0−f1−f2+f3 cost10=k10+f0−f1+f2−f3 cost11=k11+f0−f1+f2+f3 cost12=k12+f0+f1−f2−f3 cost13=k13+f0+f1−f2+f3 cost14=k14+f0+f1+f2−f3 cost15=k15+f0+f1+f2+f3

As we only care about finding the minimum, there is no change in result if f0+f1+f2+f3 is added to each cost. Then we have:

(81) cost 0=k0 cost 1=k1+2*f3 cost 2=k2+2*+f2 cost3=k3+2*+f2+2*f3 etc.

Now the selection of cost0 and cost1 as the minimum candidate can be found without regard to the values of f0, f1, or f2. Similarly, the best candidate between cost2 and cost 3 can be found without knowing f0, f1, or f2, as f2 is a constant in both. So using only the k values and f3, the number of candidates can be halved. The ACS block of FIG. 9 performs this function.

Using only f2, and the results of the above calculations, the number of candidates can again be reduced by fifty percent (50%) with another stage of ACS elements. Similarly, this tree can be repeated until only one candidate, the best match, is selected.

By inclusion of weighting values in the distance calculations, a weighted look-ahead modulator is constructed with the same structure as above. The K values, and the multiplication constants used in the calculation of the e values will be modified by weights, which can be the only modification used.

One embodiment of C++ code to perform the ACS functions follows:

```
//
// Use and ACS (add-compare-select) inverse tree for the search
//
int sd9::quantacs(void){
    int acs[32768];
    int impdot[16];
    int i,j,qt;
//
// First, calculate the depth impulse response correlations
//
    for(i=0;i<depth;i++){
        impdot[i]=0;
        for(j=i;j<depth;j++)impdot[i]+=int(floor(.5+sv[lastsv-j]*
           impulse[i][j]));
    }
//
// Now do the (depth-1) stages of ACS. The first stage will
// have 2^(depth-1) ACS elements
// the last will have 2
//
// Most future done first, allows last acs to determine quantizer output
//
    int lentab; int *p2=sumsq;
    for(i=depth-1,lentab=leftbit;i>0;lentab>>=1,i--){
        int *p1=acs;
        int dot=impdot[i]<<1;
        for(j=0;j<lentab;j++){
            int t1 = *p2++;
            int t2 = *p2++ - dot;
            *p1++ = ___min(t1,t2);
        }
        p2=acs;
    }
// The final stage is a single acs, with the mux output controlling
the final result.
    qt = (acs[0]) >= (acs[1] - (impdot[0]<<1)) ? -1:1;
    return qt;
}
```

Figure 11:
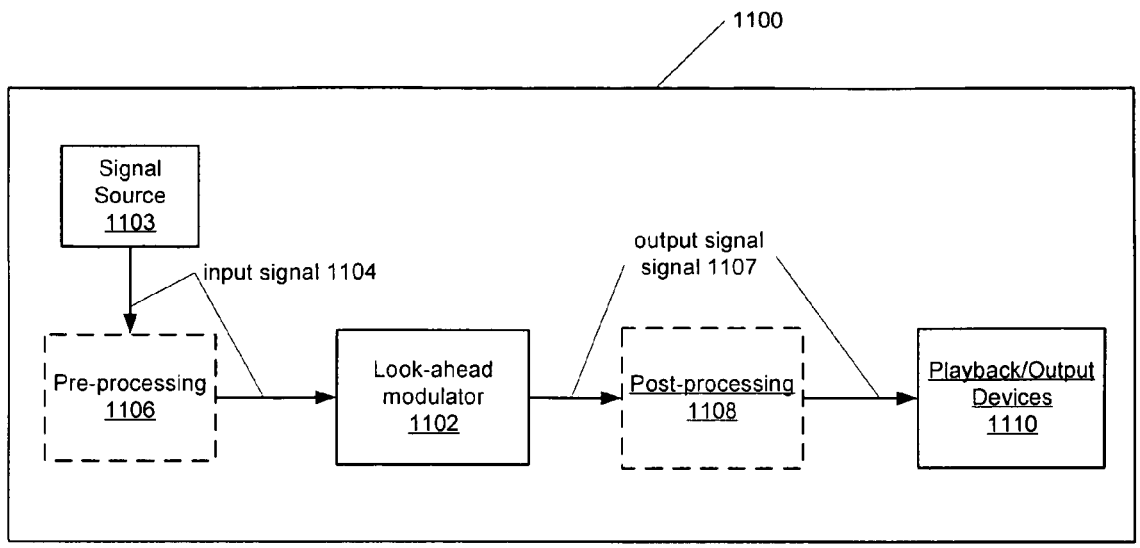
FIG. 11 depicts a signal processing system that includes a look-ahead modulator, an output device and process, and an output medium.

Referring to FIG. 11, signal processing system 1100 depicts one embodiment of a signal processing system that includes look-ahead modulator 500. Signal processing system 1100 is particularly useful for high-end audio applications such as super audio compact disk ("SACD") recording applications. Signal processing system 1100 processes an input signal 1104 generated by an input signal source 1103. The input signal 1104 may be digital or analog and may be from any signal source including signals generated as part of a recording/mixing process or other high end audio sources or from lower-end sources such as a compact disk player, MP3 player, audio/video system, audio tape player, or other signal recording and/or playback device.

The input signal 1104 may be an audio signal, a video signal, an audio plus video signal, and/or other signal type. Generally, input signal 1104 undergoes some preprocessing 1106 prior to being modulated by look-ahead modulator 1102. For example, pre-processing 1106 can involve an interpolation filter to oversample a digital input signal 1204 in a well-known manner. Pre-processing 1106 can include an analog-to-digital converter to convert an analog input signal 1104 into a digital signal. Pre-processing 1106 can also include mixing, reverberation, equalization, editing, out-of-band noise filtering and other filtering operations.

In the digital domain, pre-processing 1106 provides discrete input signals X[n] to look-ahead modulator 1102. Each discrete input signal x[n] is a K-bit signal, where K is greater than one. As previously described in more detail, look-ahead modulator 500 processes input signals X[n] and candidates Y[n] to determine an output signal 1107. Output signal 1107 is, for example, a collection of one-bit output values. The output signal 1107, thus, becomes an encoded version of the input signal 1104.

Figure 12:
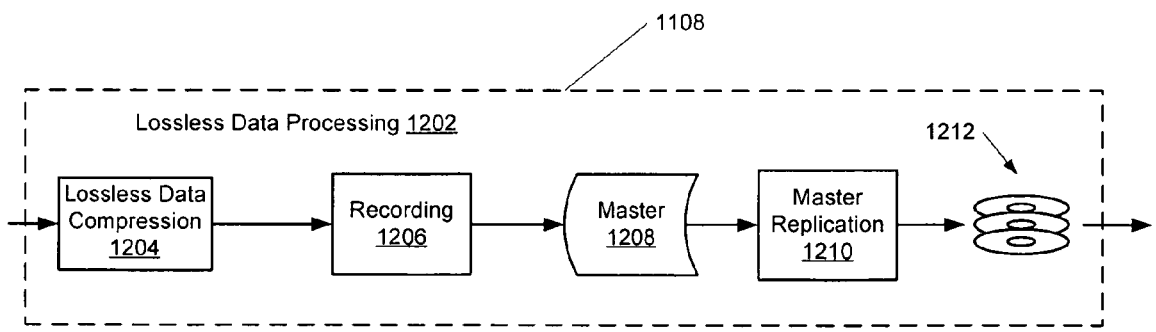
FIG. 12 depicts post-processing operations in an embodiment of the signal processing system of FIG. 11.

Referring to FIGS. 11 and 12, signal processing system 1100 typically includes post-processing 1108 to post-process the output signal 1107 of look-ahead modulator 500. Post-processing 1108 can include lossless data processing 1202. For SACD audio mastering, there is a lossless data compression stage 1204, followed by a recording process 1206 that produces the actual pits that are burned into a master storage medium 1208. The master storage medium 1208 is then mechanically replicated to make the disks (or other storage media) 1212 available for widespread distribution. Disks 1212 are, for example, any variety of digital versatile disk, a compact disk, tape, or super audio compact disk. Playback/output devices 1110 read the data from the disks 1212 and provide a signal output in a format perceptible to users. Playback/output devices 1110 can be any output devices capable of utilizing the output signal 1107. Thus, the storage media 1208 and 1212 include data encoded using signal modulation processes achieved using look-ahead modulator 500.

Although the present invention has been described in detail, it should be understood that various changes, substitutions and alterations can be made hereto without departing from the spirit and scope of the invention as defined by the appended claims. For example, quantization process 700 can be used in conjunction with conventional pruning techniques, which would reduce the fidelity of the output data but can also further simply calculations.

What is claimed is:

1. A method of processing a signal using a multiple output infinite impulse response ("IIR") filter of a look-ahead delta-sigma modulator, the method comprising:
   determining a set of state variables for respective stages of the IIR filter for a time t from a set of input signals, wherein at least a subset of the state variables of the respective stages of the IIR filter represent a current response and at least one future response element of a natural response vector of the IIR filter, wherein t represents a time index value; and
   determining a quantization output of the look-ahead delta sigma modulator for the time t using the natural response vector determined for the time t.

2. The method as in claim 1 further comprising:
   determining a set of forced pattern responses of the IIR filter of the look-ahead delta sigma modulator to a set of output candidate vectors; and
   determining a quantization output further comprises:
      quantizing each input signal sample by applying predetermined decision criteria to determine a best match between each forced pattern response and the natural IIR filter response vector and selecting output data from an output candidate vector associated with the forced pattern response used to determine the best match.

3. The method as in claim 2 wherein determining the set of forced pattern responses of the IIR filter of the look-ahead delta sigma modulator further comprises precomputing the set of forced pattern responses before quantizing each input signal data sample.

4. The method as in claim 1 wherein the look-ahead delta-sigma modulator has a look-ahead depth of M, the number of multiple natural response outputs of the IIR filter used for determining a quantization output of the look-ahead delta sigma modulator for the time t is less than or equal to M, and M is an integer greater than or equal to two.

5. The method as in claim 1 further comprising:
   providing zero feedback from a quantizer of the look-ahead delta-sigma modulator to the IIR filter prior to determining the multiple natural response outputs of the IIR filter for each set of the input signal samples.

6. The method as in claim 1 wherein the set of multiple input signal samples comprises a current input signal and at least one future input signal sample.

7. The method as in claim 1 further comprising:
   for each subsequent discrete time t+1:
      providing the quantization output to the IIR filter;
      updating state variables of the IIR filter using the provided quantization output and a current input signal sample;
      repeating determining a next set of multiple natural response outputs of the IIR filter for a next set of input signal samples, wherein the next set of multiple outputs of the IIR filter represent a natural response vector of the IIR filter for each subsequent time t+1; and
      determining a quantization output of the look-ahead delta sigma modulator for each subsequent time t+1 using the next set of multiple natural response outputs of the IIR filter.

8. The method as in claim 1 further comprising:
   allocating only an amount of memory for state variables equal to the order of the IIR filter plus the depth of the look-ahead delta-sigma modulator.

9. The method as in claim 1 further comprising:
   determining the IIR filter natural response vector only once for quantization of each set of input signal samples.

10. The method as in claim 1 wherein the input signal data sample comprises audio input signal data.

11. The method as in claim 1 further comprising:
    recording quantized input signal data on storage media.

12. The method as in claim 1 wherein determining a natural IIR filter response comprises setting feedback data to the IIR filter to at least approximately zero and filtering the set of input data signal samples.

13. A method of processing a signal using a multiple output infinite impulse response ("IIR") filter of a look-ahead delta-sigma modulator, the method comprising:
   updating a set of state variables of the IIR filter;
   conducting a memory-less operation to determine elements of a natural response vector using the updated set of state variables, wherein the elements of the natural response vector include a current response output and at least one future response output of the IIR filter to a set of input signal samples; and
   determining a quantization output of the look-ahead delta sigma modulator for time t using the natural response outputs.

14. The method of claim 13 wherein conducting a memory-less operation to determine elements of a natural response vector further comprises:
   providing at least approximately zero feedback from a quantizer of the look-ahead delta-sigma modulator to determine the elements of the natural response.

15. The method of claim 13 further comprises:
   storing the updated state variables once in a memory; and
   wherein conducting a memory-less operation to determine elements of a natural response vector comprises retrieving the stored updated variables once from the memory to determine elements of the natural response vector using the updated set of state variables.

16. A signal processing system comprising:
   a look-ahead delta sigma modulator having a depth of M, the look-ahead delta sigma modulator comprising:
      an infinite impulse response (IIR) loop filter to filter a set of input signal samples, the IIR loop filter having K natural response outputs for each of K elements of a natural response vector $SNAT_t$ for each time t, wherein at least one output is for a future output and $1<K \leq M$, wherein K and M are integers; and
      a quantizer to determine a quantization output for each time t using the natural response vector $SNAT_t$.

17. The signal processing system as in claim 16 wherein the set of input signal samples comprises a current input signal sample and M−1 future input signal samples.

18. The signal processing system as in claim 16 further comprising:
   a forced pattern response generator coupled to the IIR loop filter to determine a set of forced pattern responses of the loop filter to a set of output candidate vectors.

19. The signal processing system as in claim 16 wherein the pattern generator determines the set of forced pattern responses of the loop filter to a set of vectors obtained by setting signal input data to the loop filter to at least approximately zero and filtering the set of vectors.

20. The signal processing system as in claim 16 wherein the quantizer further comprises a function generator to quantize each input signal data sample by applying predetermined decision criteria to determine a best match between each forced pattern response and the natural response vector $SNAT_t$ and selecting output data from the output candidate vector associated with the forced pattern response used to determine the best match.

21. The signal processing system as in claim 16 wherein the IIR loop filter further comprises:
   a first set of filter stages;
   a second set of filter delay stages sequentially coupled to a last of the first set of filter stages, wherein elements of the natural response vector $SNAT_t$ are state variables of the second set of filter delay stages.

22. The signal processing system as in claim 16 wherein the IIR loop filter further comprises:
   a first set of filter stages;
   a second set of filter delay stages sequentially coupled to a last of the first set of filter stages, wherein elements of the natural response vector $SNAT_t$ are derived from state variables of the second set of filter delay stages.

23. The signal processing system as in claim 16 wherein the natural response generator determines the natural response vector $SNAT_t$ by setting feedback data to the loop filter to at least approximately zero and filtering current input signal samples and M−1 future input signal samples.

24. The signal processing system as in claim 16 wherein the natural response generator determines the natural response vector $SNAT_t$ only once for quantization of each filtered input signal data sample.

25. The signal processing system as in claim 16 wherein the input signal data sample comprises audio input signal data.

26. The signal processing system as in claim 16 further comprising:
   signal processing and recording equipment to process output data from the quantizer and record the processed output data on storage media.

27. The signal processing system as in claim 16 wherein the look-ahead delta-sigma modulator is implemented using software.

28. An apparatus for processing a signal using a multiple output infinite impulse response ("IIR") filter of a look-ahead delta-sigma modulator, the apparatus comprising:
   means for determining a set of state variables for respective stages of the IIR filter for a time t from a set of input signals, wherein at least a subset of the state variables of the respective stages of the IIR filter represent a current response and at least one future response element of a natural response vector of the IIR filter, wherein t represents a time index value; and
   means for determining a quantization output of the look-ahead delta sigma modulator for the time t using the natural response vector determined for the time t.

29. A method of determining feedback coefficients for a multiple output, L-order, infinite impulse response ("IIR") filter of a look-ahead delta-sigma modulator of depth M, wherein the IIR filter includes a plurality of state variables and M is an integer greater than one, the method comprising:
   determining feedback coefficients for the IIR filter from the state variables using (i) an at least approximately zero input, (ii) feedback coefficients setting a characteristic of the IIR filter without K−1 natural response delay stages, wherein $1<K \leq M$, and (iii) an impulse function forced feedback response followed by L−1 at least approximately zeros, wherein the feedback coefficients for the IIR filter comprise state variables of each of the initial stages and the K−1 natural response delay stages after completion of the impulse function and L−1 zeros, wherein K and L are integers.

* * * * *